(12) United States Patent
Xu et al.

(10) Patent No.: US 11,997,890 B2
(45) Date of Patent: May 28, 2024

(54) DISPLAY SUBSTRATE AND METHOD FOR MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Peng Xu, Beijing (CN); Jiangtao Deng, Beijing (CN); Weiwei Ding, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 830 days.

(21) Appl. No.: 17/051,129

(22) PCT Filed: Nov. 20, 2019

(86) PCT No.: PCT/CN2019/119581
§ 371 (c)(1),
(2) Date: Oct. 27, 2020

(87) PCT Pub. No.: WO2021/097690
PCT Pub. Date: May 27, 2021

(65) Prior Publication Data
US 2023/0157095 A1    May 18, 2023

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/80521* (2023.02); *H10K 59/873* (2023.02); *H10K 59/122* (2023.02)

(58) Field of Classification Search
CPC ............. H10K 59/131; H10K 59/1201; H10K 59/80521; H10K 59/873; H10K 59/122
See application file for complete search history.

(56) References Cited

U.S. PATENT DOCUMENTS

2019/0326370 A1    10/2019 Lu
2020/0035773 A1    1/2020 Cheng
(Continued)

FOREIGN PATENT DOCUMENTS

CN    206134686 U        4/2017
CN    106847867 A    *   6/2017    ......... H01L 27/3244
(Continued)

OTHER PUBLICATIONS

European Patent Office. Extended European Search Report dated Oct. 28, 2022 for European Patent Application No./Patent No. 19946248.2-1212/4064358 PCT/CN2019119581. 7 pages.
Office Action dated Dec. 14, 2023, in CN Application No. 201980002494.8.

*Primary Examiner* — Nathanael R Briggs
(74) *Attorney, Agent, or Firm* — Procopio, Cory, Hargreaves & Savitch LLP

(57) ABSTRACT

A display substrate includes a base, a voltage signal line, a driving circuit structure, a cathode overlapping layer and a cathode layer. The voltage signal line is located in the non-display region and is arranged around the display region. The driving circuit structure is located in the non-display region, and is located at a side of the voltage signal line proximate to the display region in a first direction. The cathode overlapping layer is located in the non-display region and is arranged around the display region. At least a
(Continued)

part of a surface of a first portion of the cathode overlapping layer proximate to the base is in electrical contact with a corresponding part of the voltage signal line. An orthographic projection of a second portion of the cathode overlapping layer on the base at least partially overlaps an orthographic projection of the driving circuit structure on the base.

15 Claims, 15 Drawing Sheets

(51) Int. Cl.
     *H10K 59/122*     (2023.01)
     *H10K 59/80*      (2023.01)

(56) References Cited

U.S. PATENT DOCUMENTS

2020/0365680 A1* 11/2020 Nakamura ............. H10K 50/82
2021/0408460 A1* 12/2021 Lu ........................ H10K 50/844

FOREIGN PATENT DOCUMENTS

| | | |
|---|---|---|
| CN | 106847867 A | 6/2017 |
| CN | 108649063 A | 10/2018 |
| CN | 109037282 A | 12/2018 |
| CN | 110416266 A | 11/2019 |
| KR | 20180079024 A | 7/2018 |
| WO | 2019142582 A1 | 7/2019 |

* cited by examiner

DISPLAY SUBSTRATE AND METHOD FOR MANUFACTURING THE SAME, AND DISPLAY DEVICE

CROSS-REFERENCE TO RELATED APPLICATION

This application is a national phase entry under 35 USC 371 of International Patent Application No. PCT/CN2019/119581 filed on Nov. 20, 2019, which is incorporated herein by reference in its entirety.

TECHNICAL FIELD

The present disclosure relates to the field of display technologies, and in particular, to a display substrate and a method for manufacturing the same, and a display device.

BACKGROUND

Electroluminescent display substrates have the advantages of active luminescence, wide visual range, fast response and the like, and are widely applied to display devices.

SUMMARY

In one aspect, a display substrate is provided. The display substrate has a display region and a non-display region adjacent to the display region. The display substrate includes a base, a voltage signal line disposed at a first side of the base, a driving circuit structure disposed at the first side of the base, a cathode overlapping layer disposed at a side of the voltage signal line and a side of the driving circuit structure that are away from the base in a direction perpendicular to the base, and a cathode layer disposed at the first side of the base. The voltage signal line is located in the non-display region and is arranged around the display region. The driving circuit structure is located in the non-display region and is located at a side of the voltage signal line proximate to the display region in a first direction. The cathode overlapping layer is located in the non-display region and is arranged around the display region. The cathode overlapping layer includes a first portion and a second portion, the first portion is disposed away from a display region than the second portion, the second portion extends along a direction approaching the display region, and the first portion is connected to the second portion. At least a part of a surface of the first portion proximate to the base is in electrical contact with a corresponding part of the voltage signal line. An orthographic projection of the second portion on the base at least partially overlaps an orthographic projection of the driving circuit structure on the base. The cathode layer extends from the display region to the non-display region, and an edge of the cathode layer is located in the non-display region. The cathode layer is in electrical contact with at least a part of a surface of the second portion of the cathode overlapping layer away from the base. The first direction is a direction parallel to the base and perpendicular to an interface between the display region and the non-display region.

In some embodiments, the display substrate further includes a pixel defining layer disposed at the first side of the base. The pixel defining layer includes a pixel defining layer body located at a side of the cathode layer proximate to the base in the direction perpendicular to the base. The pixel defining layer body extends from the display region to the non-display region, and an edge of the pixel defining layer body is located in the non-display region. The pixel defining layer body covers an edge of the cathode overlapping layer proximate to the display region in the first direction, and covers a part of the surface of the second portion of the cathode overlapping layer away from the base. The edge of the pixel defining layer body is closer to the display region than the edge of the cathode layer in the first direction. A part of the pixel defining layer body located in the display region has a plurality of openings, and the plurality of openings are configured to define light-emitting regions of a plurality of sub-pixels.

In some embodiments, the display substrate further includes: a source-drain metal layer disposed at the first side of the base, and a planarization layer disposed on the first side of the base. The voltage signal line and both a source and a drain included in the driving circuit structure are located in the source-drain metal layer. The planarization layer includes a planarization layer body disposed between the source-drain metal layer, and the pixel defining layer body and the cathode overlapping layer. The planarization layer body extends from the display region to the non-display region. An edge of the planarization layer body is located in the non-display region. The planarization layer body completely covers the driving circuit structure. The cathode overlapping layer covers the edge of the planarization layer body in the non-display region, and covers at least a part of a surface of the planarization layer body away from the base.

In some embodiments, the cathode overlapping layer has a plurality of through holes distributed in an array. At least one through hole of the plurality of through holes penetrates the cathode overlapping layer. An orthographic projection of at least one of the plurality of through holes on the base is within a range of an orthographic projection of the planarization layer body on the base. The display substrate further includes a plurality of fillers that are filled in the plurality of through holes in a one-to-one correspondence manner. A material of at least one filler of the plurality of fillers is the same as a material of the pixel defining layer body.

In some embodiments, the display substrate further includes a first barrier dam disposed at the first side of the base. The first barrier dam is located in the non-display region. The source-drain metal layer extends to a side face of the first barrier dam proximate to the display region in a direction from the display region to the non-display region. The cathode overlapping layer extends to the side face of the first barrier dam proximate to the display region in the direction from the display region to the non-display region. A part of the cathode overlapping layer in electrical contact with the voltage signal line is located between the planarization layer body and the first barrier dam in the first direction.

In some embodiments, the first barrier dam includes a material for forming the pixel defining layer body, or a material for forming the planarization layer body, or the material for forming the pixel defining layer body and the material for forming the planarization layer body.

In some embodiments, the display substrate further includes an inorganic insulating layer disposed at the first side of the base. The inorganic insulating layer includes an interlayer dielectric layer closer to the base than the source-drain metal layer. The interlayer dielectric layer extends from the display region to the non-display region, and an edge of the interlayer dielectric layer is located at a side of the first barrier dam away from the display region in the first direction. At least one groove is formed in a part of the interlayer dielectric layer extending to a side of the first barrier dam away from the display region in the first direction. The at least one groove is arranged around the first barrier dam.

In some embodiments, the display substrate further includes: an anode layer disposed between the planarization layer body and the pixel defining layer body in the direction perpendicular to the base and located in the display region, and at least one organic functional layer disposed on a side of the pixel defining layer body away from the base in the direction perpendicular to the base. The anode layer includes a plurality of anodes that are in one-to-one correspondence with the plurality of openings. The at least one organic functional layer extends from the display region to the non-display region, an edge of the at least one organic functional layer is located in the non-display region, and the edge of the at least one organic functional layer is closer to the display region than the edge of the pixel defining layer body in the first direction.

In some embodiments, the at least one organic functional layer includes at least one of an electron transport layer, an electron injection layer, an organic light-emitting layer, a hole transport layer or a hole injection layer.

In some embodiments, the display region is substantially rectangular, and the cathode overlapping layer is arranged around two long sides and one short side of the rectangular display region.

In some embodiments, in a region of the non-display region corresponding to the two long sides, a width of a part of the cathode layer that is in contact with the cathode overlapping layer in the first direction is $D_1$, and $D_1$ is greater than or equal to 150 μm and less than or equal to 350 μm. In a region of the non-display region corresponding to the one short side, a width of the part of the cathode layer that is in contact with the cathode overlapping layer in the first direction is $D_2$, and $D_2$ is less than $D_1$ and greater than zero.

In some embodiments, the display substrate further includes a light extraction layer disposed on a side of the cathode layer away from the base in the direction perpendicular to the base. The light extraction layer extends from the display region to the non-display region, and an edge of the light extraction layer is located in the non-display region. An orthographic projection of at least a part of the edge of the light extraction layer on the base is within a range of an orthographic projection of the cathode layer on the base.

In some embodiments, an orthographic projection of the edge of the light extraction layer on the base substantially coincides with an orthographic projection of the edge of the cathode layer on the base.

In some embodiments, the display substrate further includes an anti-reflection layer disposed on a side of the light extraction layer away from the cathode layer in the direction perpendicular to the base. The anti-reflection layer extends from the display region to the non-display region, and an edge of the anti-reflection layer is located in the non-display region. An orthographic projection of the anti-reflection layer on the base is within the range of the orthographic projection of the cathode layer on the base.

In some embodiments, the anti-reflection layer includes a lithium fluoride layer.

In some embodiments, the display substrate further includes a second barrier dam disposed on a surface of the cathode overlapping layer away from the base. The second barrier dam is located in the non-display region, and the second barrier dam is nonoverlapping with the cathode layer, the light extraction layer and the anti-reflection layer in the direction perpendicular to the base.

In some embodiments, a distance between the edge of the cathode layer and the second barrier dam in the first direction is greater than or equal to 80 μm; a distance between the edge of the anti-reflection layer and the second barrier dam in the first direction is greater than or equal to 250 μm.

In some embodiments, the display substrate further includes an encapsulation layer. The encapsulation layer includes: a first inorganic barrier layer disposed on a side of the anti-reflection layer away from the light extraction layer, an organic barrier layer disposed on a side of the first inorganic barrier layer away from the anti-reflection layer, and a second inorganic barrier layer disposed on a side of the organic barrier layer away from the first inorganic barrier layer. The first inorganic barrier layer covers the second barrier dam. The organic barrier layer is located at least in a region enclosed by the second barrier dam; the second inorganic barrier layer covers the second barrier dam.

In another aspect, a method for manufacturing a display substrate is provided. The display substrate includes a display region and a non-display region adjacent to the display region. The method includes: providing a base; forming a voltage signal line and a driving circuit structure at a first side of the base; forming a cathode overlapping layer on the base on which the voltage signal line and the driving circuit structure have been formed; and forming a cathode layer on the base on which the cathode overlapping layer has been formed. The voltage signal line is located in the non-display region and is arranged around the display region, and the driving circuit structure is located in the non-display region and is located at a side of the voltage signal line proximate to the display region in the first direction. The cathode overlapping layer is located in the non-display region and is arranged around the display region; the cathode overlapping layer includes a first portion and a second portion, the first portion is disposed away from the display region than the second portion, the second portion extends along a direction approaching the display region, and the first portion being connected to the second portion. At least a part of a surface of the first portion proximate to the base is in electrical contact with a corresponding part of the voltage signal line. An orthographic projection of the second portion on the base at least partially overlaps an orthographic projection of the driving circuit structure on the base. The cathode layer extends from the display region to the non-display region, an edge of the cathode layer is located in the non-display region, and the cathode layer is in electrical contact with at least a part of a surface of the second portion of the cathode overlapping layer away from the base. The first direction is a direction parallel to the base and perpendicular to an interface between the display region and the non-display region.

In some embodiments, before the step of forming the cathode overlapping layer on the base on which the voltage signal line and the driving circuit structure have been formed, the method further includes: forming a patterned planarization layer at the first side of the base. The patterned planarization layer includes a planarization layer body and a first barrier layer. The planarization layer body extends from the display region to the non-display region, and an edge of the planarization layer body is located in the non-display region. The planarization layer body is nonoverlapping with the voltage signal line in a direction perpendicular to the base. The first barrier layer is located at a side of the voltage signal line away from the display region in the first direction.

In some embodiments, before the step of forming the cathode layer on the base on which the cathode overlapping layer has been formed, the method further includes: forming a patterned pixel defining layer at the first side of the base. The patterned pixel defining layer includes a pixel defining layer body, a plurality of fillers, a second barrier layer and a third barrier layer. The pixel defining layer body extends from the display region to the non-display region, and an edge of the pixel defining layer body is located in the non-display region. The pixel defining layer body covers an edge of the cathode overlapping layer proximate to the display region in the first direction, and covers a part of the surface of the second portion of the cathode overlapping layer away from the base. The edge of the pixel defining layer body is closer to the display region than the edge of the cathode layer. A part of the pixel defining layer body located in the display region has a plurality of openings. The plurality of openings are configured to define light-emitting regions of a plurality of sub-pixels. The cathode overlapping layer has a plurality of through holes distributed in an array. At least one through hole of the plurality of through holes penetrates a surface of the cathode overlapping layer away from the base and a surface of the cathode overlapping layer proximate to the base. The plurality of fillers are filled in the plurality of through holes in a one-to-one correspondence manner. The second barrier layer is located on a surface of the first barrier layer away from the base in a direction perpendicular to the base. The third barrier layer is located on a surface of the cathode overlapping layer away from the base. The second barrier dam is nonoverlapping with the cathode layer, the light extraction layer and the anti-reflection layer in the direction perpendicular to the base.

In yet another aspect, a display device is provided. The display device includes the display substrate as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on an actual size of a product and an actual process of a method that the embodiments of the present disclosure relate to.

DETAILED DESCRIPTION

Figure 1:
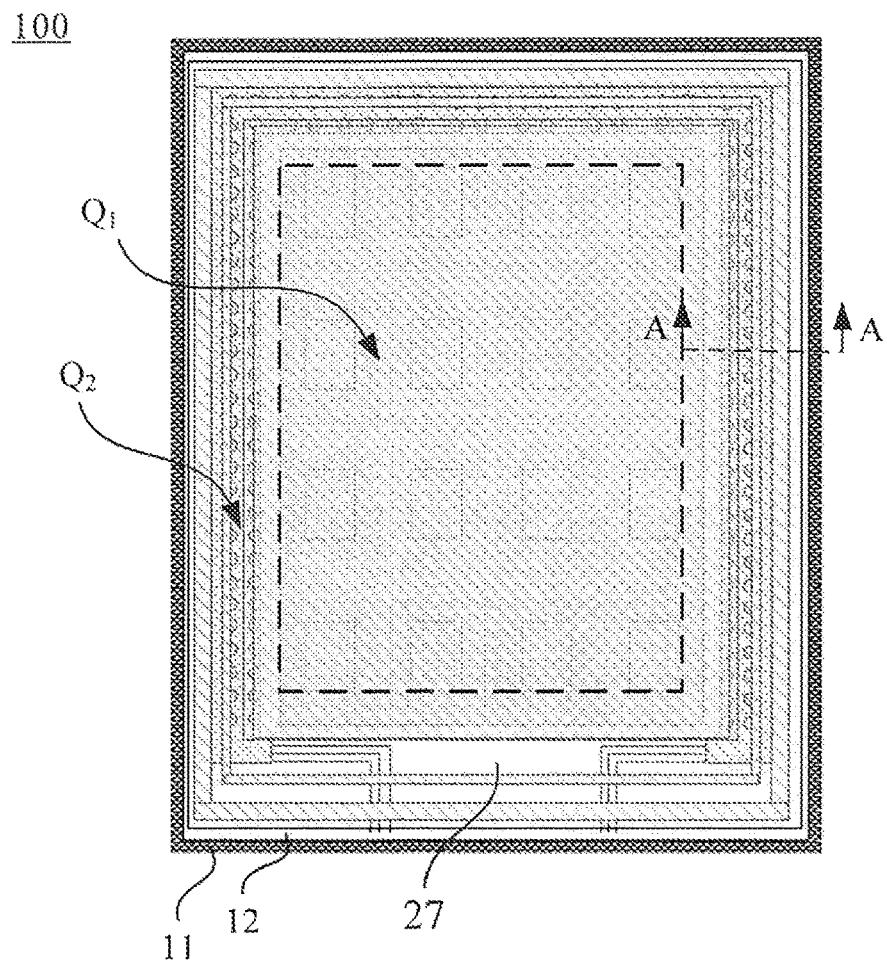
FIG. 1 is a top view of a display substrate, in accordance with some embodiments of the present disclosure.

Technical solutions in some embodiments of the present disclosure will be described clearly and completely in combination with accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

A display substrate has a display region and a non-display region. A plurality of sub-pixels are disposed in the display region, and each sub-pixel at least includes a pixel circuit structure, an anode, a light-emitting portion and a cathode, which are sequentially superposed. A driving voltage is applied to the light-emitting portion by the anode and the cathode, so that the light-emitting portion may emit light under action of the driving voltage, and an image display may be realized through light emission of light-emitting portions of the plurality of sub-pixels. The non-display region is adjacent to the display region, and the non-display region surrounds the display region. A voltage signal line and a cathode overlapping layer are disposed in the non-display region, and the voltage signal line is in electrical contact with a lower surface of the cathode overlapping layer.

Cathodes of the plurality of sub-pixels constitute a cathode layer (the cathode layer is an entire layer, or a part of the cathode layer in the display region has a pattern), and the cathode layer extends from the display region to the non-display region and overlaps an upper surface of the cathode overlapping layer, so that the cathodes in the cathode layer may be electrically connected to one or more voltage signal lines.

Currently, how to reduce a bezel of a display device and improve a screen-to-body ratio of the display device (i.e., a proportion of a screen area of the display device at a display side thereof to a total area of a surface of the display device at the display side, and the total area of the surface of the display device at the display side includes the screen area and a bezel area) is one of research trends in the field. The inventors of the present disclosure have studied and found that, in the display substrate described above, in order to ensure that the cathode layer is in good contact with the cathode overlapping layer, the cathode layer extends above the cathode overlapping layer and covers an entire upper surface of the cathode overlapping layer, which results in that an area of the cathode layer is relatively large. In this case, an area of an encapsulation layer of the display substrate must be set to be larger to ensure encapsulation reliability. This will increase a proportion of the non-display region of the display substrate to the entire display substrate, and thereby the bezel of the display device using the display substrate is correspondingly increased and the screen-to-body ratio of the display device is decreased.

Figure 2:
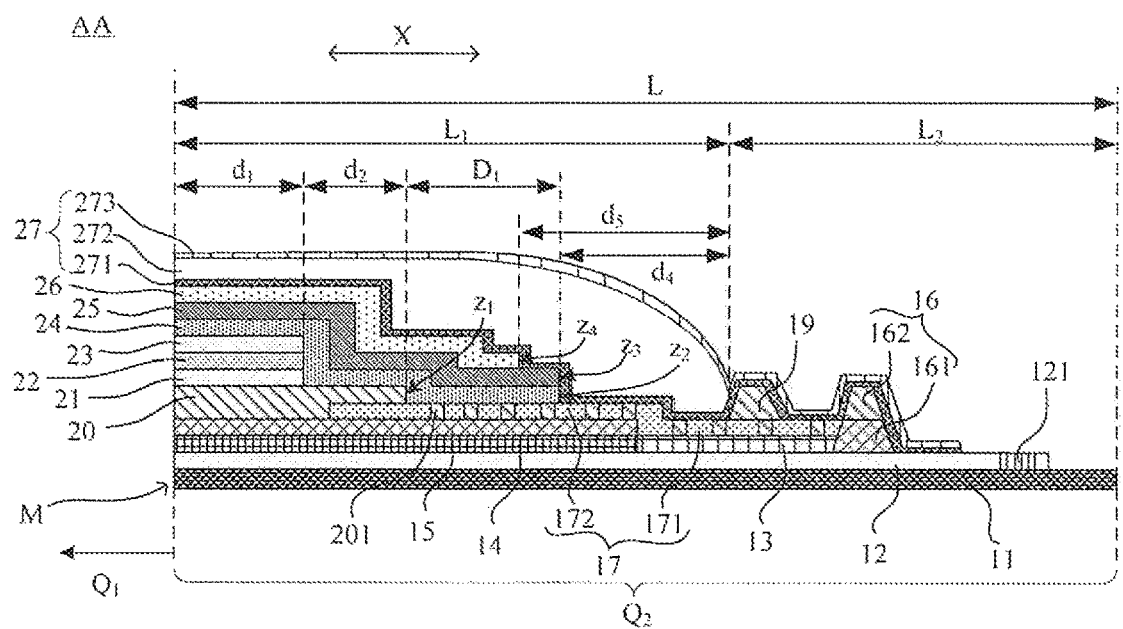
FIG. 2 is a section showing a partial structure of the display substrate in FIG. 1 along the AA direction.

Referring to FIGS. 1 and 2, some embodiments of the present disclosure provide a display substrate 100. The display substrate 100 has a display region $Q_1$, and a non-display region $Q_2$ adjacent to the display region. The non-display region $Q_2$ is arranged around the display region $Q_1$ in a circle. The display substrate 100 includes a base 11, a voltage signal line 13, a driving circuit structure 14, a cathode overlapping layer 17 and a cathode layer 24.

The voltage signal line 13 is disposed at a first side of the base 11. The voltage signal line 13 is located in the non-display region $Q_2$, and is arranged around the display region $Q_1$. For example, in the display substrate 100 shown in FIG.

3, the display region $Q_1$ is substantially rectangular. The voltage signal line 13 is arranged around two long sides and one short side of the display region $Q_1$, and is led out in a direction away from the display region $Q_1$ after extending a certain distance along the other short side.

Figure 3:
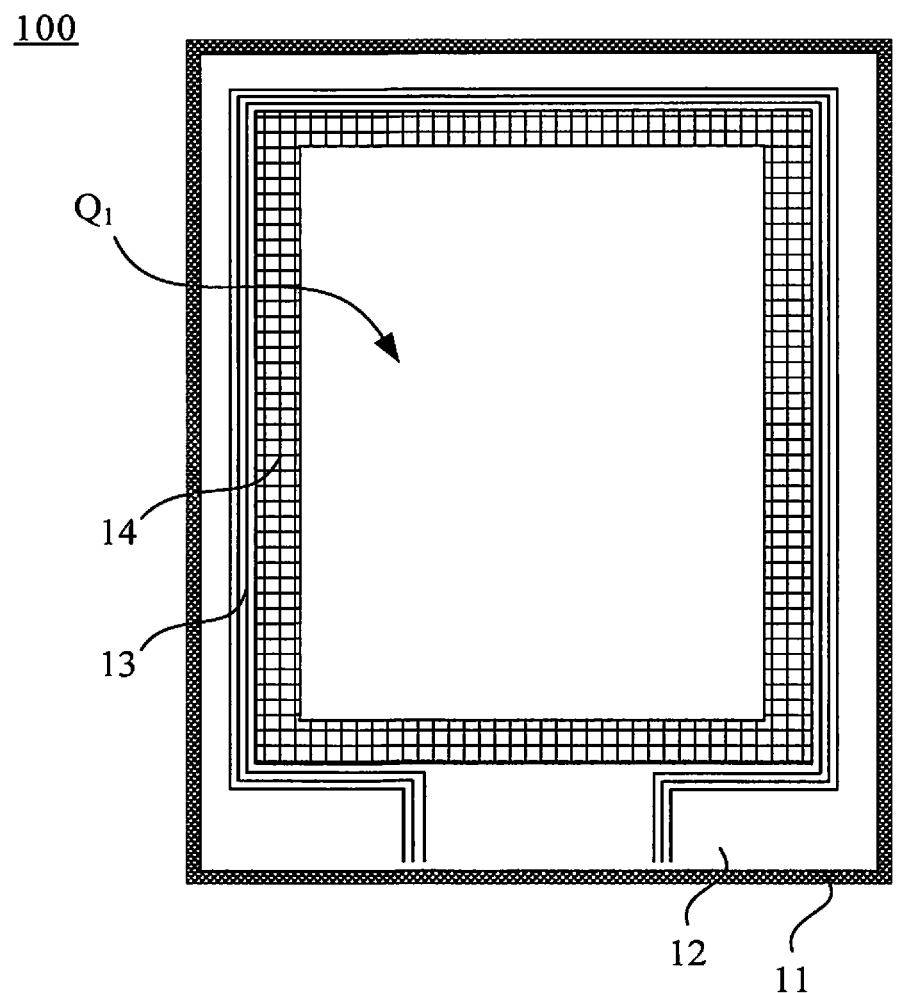
FIGS. 3 to 13 are top views corresponding to steps in a process of manufacturing a display substrate, in accordance with some embodiments of the present disclosure.

The driving circuit structure 14 is disposed at the first side of the base 11. The driving circuit structure 14 is located in the non-display region $Q_2$, and is located at a side of the voltage signal line 13 proximate to the display region $Q_1$ in a first direction X. For example, as shown in FIG. 3, the driving circuit structure 14 is arranged around the display region $Q_1$ in a circle. It will be noted that the driving circuit structure 14 is configured to drive pixel circuit structures in the sub-pixels as described above, so that the light-emitting portions in the sub-pixels emit light. The driving circuit structure 14 includes a gate driver on array (GOA) circuit, such as a light-emitting (EM) GOA and a Gate GOA. The EM GOA outputs light-emitting (EM) signals, and the Gate GOA outputs Gate signals.

The cathode overlapping layer 17 is disposed at the first side of the base 11, and is disposed at a side of the voltage signal line 13 and a side of the driving circuit structure 14 that are away from the base 11. The cathode overlapping layer 17 is located in the non-display region $Q_2$ and is arranged around the display region $Q_1$. It will be noted that the cathode overlapping layer 17 may be arranged around the display region $Q_1$ in a complete circle, or may be arranged around a part of an edge of the display region. For example, in the display substrate 100 shown in FIG. 5, the display region $Q_1$ is substantially rectangular, and the cathode overlapping layer 17 is arranged around two long sides and one short side of the display region $Q_1$. It will be understood that, in some other examples, the cathode overlapping layer 17 may be arranged only around the two long sides of the display region $Q_1$.

Figure 6:
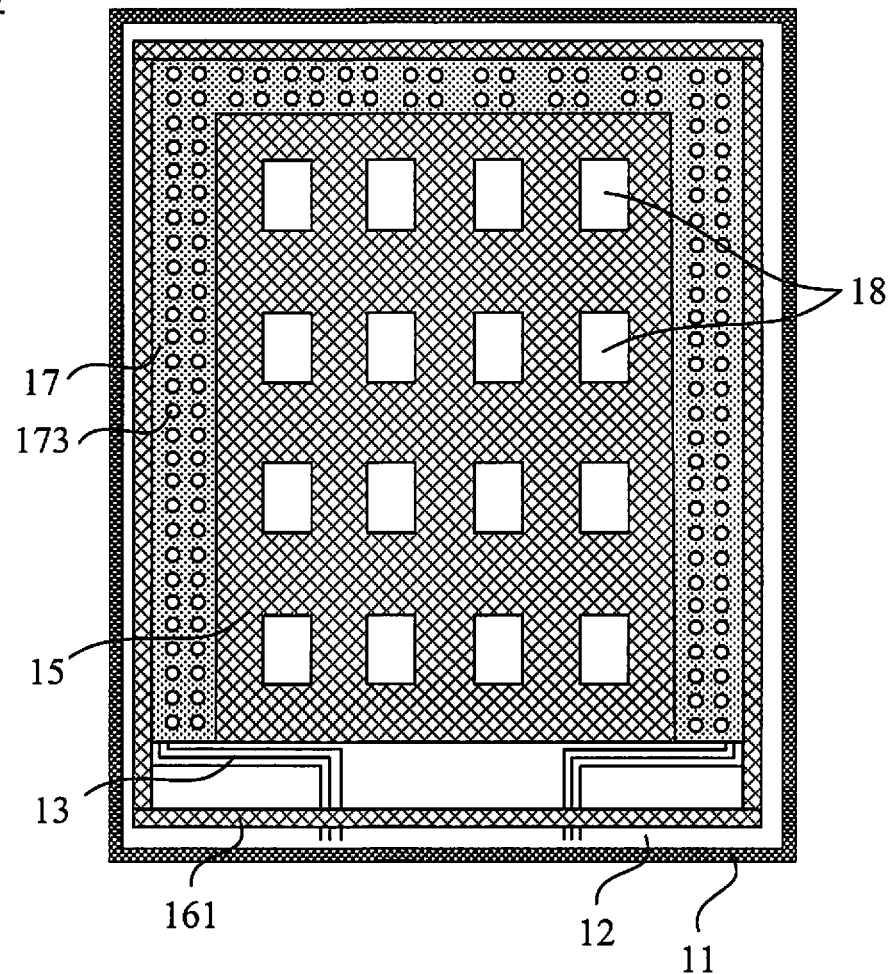
Figure 7:
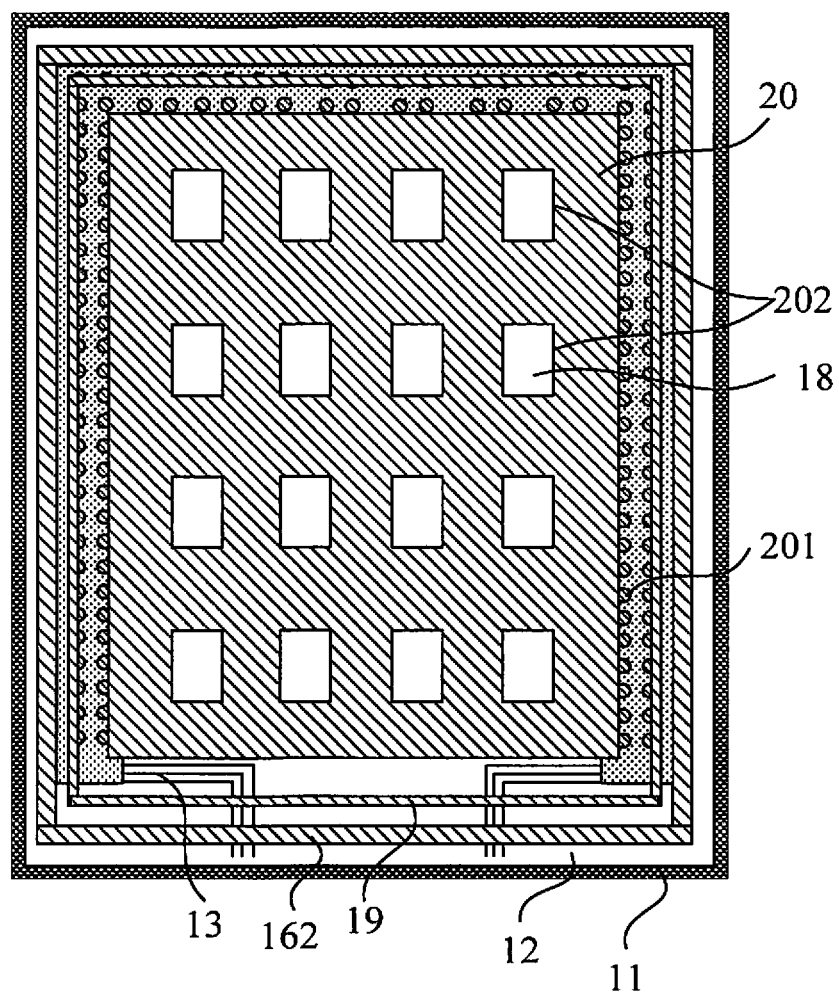

Referring to FIG. 2, the cathode overlapping layer 17 includes a first portion 171 away from the display region $Q_1$ and a second portion 172 extending along a direction approaching the display region $Q_1$, and the first portion 171 is connected to the second portion 172. At least a part of a surface of the first portion 171 proximate to the base 11 is in electrical contact with a corresponding part of the voltage signal line 13. For example, the voltage signal line 13 overlaps the at least a part of the surface of the first portion 171 proximate to the base 11 to realize an electrical connection. An orthographic projection of the second portion 172 on the base 11 at least partially overlaps with an orthographic projection of the driving circuit structure 14 on the base 11. In this design, the second portion 172 of the cathode overlapping layer 17 is closer to the display region $Q_1$ than the first portion 171, and thereby it is beneficial to achieve electrical connection between the second portion 172 of the cathode overlapping layer 17 and the cathode layer 24 to reduce the area of the cathode layer. For example, the cathode overlapping layer 17 is manufactured in a same layer and made of a same material as an anode layer (e.g., the anode layer composed of a plurality of anodes 18 as shown in FIGS. 6 and 7) in the display region $Q_1$ of the display substrate 100. In this way, it is beneficial to simplify a manufacturing process of the display substrate 100. For example, a material of the cathode overlapping layer 17 includes at least one of a metal or a conductive metal oxide.

Figure 11:
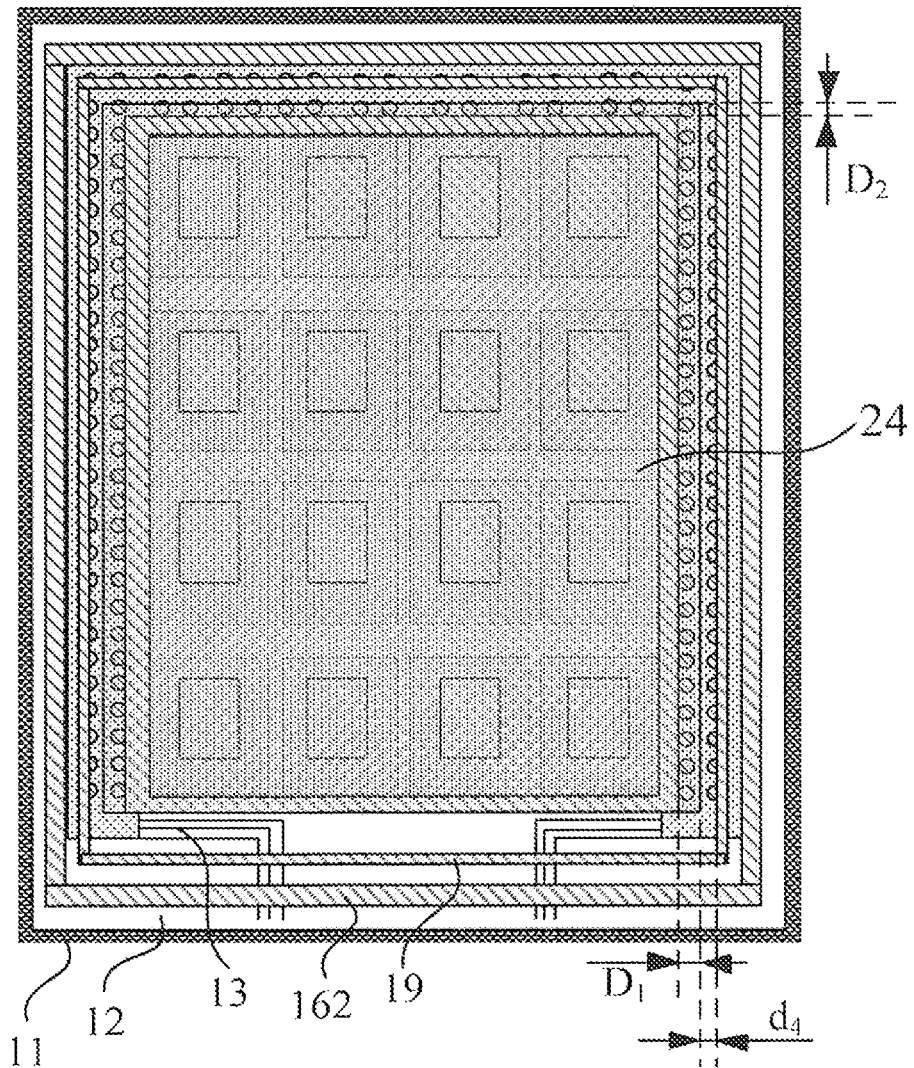

Referring to FIGS. 2 and 11, the cathode layer 24 is disposed at the first side of the base 11. The cathode layer 24 extends from the display region $Q_1$ to the non-display region $Q_2$, and an edge $z_2$ of the cathode layer 24 is located within the non-display region $Q_2$. The cathode layer 24 is in electrical contact with at least a part of a surface of the second portion 172 of the cathode overlapping layer 17 away from the base 11. For example, the cathode layer 24 lies on the at least a part of the surface of the second portion 172 away from the base to realize an electrical connection. In this design, it may ensure that the cathode layer 24 is in electrical contact with the voltage signal line 13 and the area of the cathode layer 24 may be reduced, and thereby an area of an encapsulation layer 27 may be correspondingly reduced while encapsulation reliability is guaranteed, so that a dimension of the non-display region $Q_2$ of the display substrate 100 in a first direction X is reduced, that is, the proportion of the non-display region $Q_2$ to the entire display substrate is reduced. In this way, the bezel of the display device using the display substrate 100 may be correspondingly reduced, and a screen-to-body ratio of the display device may be improved. Herein, the first direction X is parallel to the base 11 and perpendicular to an interface between the display region $Q_1$ and the non-display region $Q_2$ (i.e., a boundary surface M of the display region $Q_1$). For example, a material for the cathode layer 24 includes, but is not limited to, one or more of silver, magnesium or ytterbium.

In a case where the display region $Q_1$ is substantially rectangular, and the cathode overlapping layer 17 is arranged around two long sides and one short side of the rectangular display region $Q_1$, for example, in a region of the non-display region $Q_2$ corresponding to the two long sides, a width of a part of the cathode layer 24 that is in contact with the cathode overlapping layer 17 in the first direction X is $D_1$, and referring to FIG. 2, $D_1$ is greater than or equal to 150 μm and less than or equal to 350 μm. In a region of the non-display region $Q_2$ corresponding to the one short side, a width of the part of the cathode layer 24 that is in contact with the cathode overlapping layer 17 in the first direction X is $D_2$, and $D_2$ is less than $D_1$ and greater than zero. On the one hand, this design may ensure a contact area between the cathode layer 24 and the cathode overlapping layer 17, and a contact resistance may be reduced, and thereby it may ensure a long range uniformity (LRU) of the display substrate 100, that is, brightness at every position in the display region $Q_1$ of the display substrate 100 may be uniform; on the other hand, it is beneficial to reduce a width of the non-display region $Q_2$ of the display substrate 100 in the first direction X. In some examples, $D_1$ is within a range from 150 μm to 250 μm, for example, 150 μm, 180 μm, 200 μm, 210 μm, 230 μm or 250 μm. In some other examples, $D_1$ is within a range from 250 μm to 350 μm, for example, 260 μm, 280 μm, 300 μm, 310 μm, 330 μm or 350 μm.

For example, a width of the voltage signal line 13 in the first direction X is 150 μm to 250 μm. Therefore, in the region of the non-display region 2 corresponding to the two long sides, in order to make the cathode overlapping layer meet electrical contact requirement, a width of the cathode overlapping layer in the first direction X should be greater than or equal to 300 μm (including 150 μm where the cathode overlapping layer is in electrical contact with the cathode layer 24 and 150 μm where the cathode overlapping layer is in electrical contact with the voltage signal line).

Referring to FIG. 2, the width of the non-display region $Q_2$ of the display substrate 100 in the first direction X is L, and L is equal to a sum of $L_1$ and $L_2$ (i.e., $L=L_1+L_2$), where $L_2$ is a width that is reserved to ensure the encapsulation reliability, and $L_1$ is equal to a sum of $d_1$, $d_2$, $D_1$ and $d_4$ (i.e., $L_1=d_1+d_2+D_1+d_4$). Therefore, in a case where $D_1$ is equal to 150 μm, a value of $L_1$ is relatively small. In this case, it may not only ensure the LRU and the encapsulation reliability of the display substrate 100, but also the width L of the non-display region $Q_2$ of the display substrate 100 in the first direction X may be advantageously reduced, thereby reducing the proportion of the non-display region $Q_2$, reducing the bezel of the display device using the display substrate 100, and improving the screen-to-body ratio of the display device.

In some embodiments, referring to FIGS. 2 and 7, the display substrate 100 further includes a pixel defining layer. The pixel defining layer is disposed at the first side of the base 11. The pixel defining layer includes a pixel defining layer body 20 located at a side of the cathode layer 24 proximate to the base 11 in a direction perpendicular to the base. The pixel defining layer body 20 extends from the display region $Q_1$ to the non-display region $Q_2$. A part of the pixel defining layer body 20 extending from a boundary of the display region $Q_1$ to the non-display region $Q_2$ may have a mesh structure which has openings therein similar to the display region, or may have an entire layer structure without openings, and a part of the pixel defining layer body in the display region $Q_1$ and a part of the pixel defining layer body extending from the boundary of the display region $Q_1$ to the non-display region $Q_2$ are integrated. An edge $z_1$ of the pixel defining layer body 20 is located in the non-display region $Q_2$.

The pixel defining layer body 20 covers an edge of the cathode overlapping layer 17 proximate to the display region $Q_1$ in the first direction X, and covers a part of the surface of the second portion 172 of the cathode overlapping layer 17 away from the base 11. The edge $z_1$ of the pixel defining layer body 20 is closer to the display region $Q_1$ than the edge $z_2$ of the cathode layer 24. In this way, on the one hand, a position of the cathode overlapping layer 17 may be defined by the pixel defining layer body 20; on the other hand, a part of the surface of the second portion 172 of the cathode overlapping layer 17 away from the base 11 may be exposed, so as to prevent the pixel defining layer body 20 from affecting the electrical contact between the cathode layer 24 and the cathode overlapping layer 17. In this case, the cathode layer 24 includes a part covering the pixel defining layer body 20 and a part covering the cathode overlapping layer 17, and the two parts are continuous.

A part of the pixel defining layer body 20 located in the display region $Q_1$ has a plurality of openings 202 configured to define light-emitting regions of a plurality of sub-pixels, and thus the pixel defining layer body 20 substantially has a mesh structure in the display region $Q_1$. In this way, the display substrate 100 may display an image by controlling the plurality of sub-pixels to emit light. Herein, it will be noted that a part of the pixel defining layer body 20 located in the non-display region $Q_2$ may also have openings, and these openings located in the non-display region $Q_2$ may be provided as dummy pixels to ensure the reliability of the sub-pixels in the display region $Q_1$ or to balance the load of each row or each column, so that display brightness at the edge of the display region $Q_1$ may be improved.

In some embodiments, the display substrate 100 further includes a source-drain metal layer and a planarization layer. Referring to FIG. 2, the source-drain metal layer is disposed at the first side of the base 11. The voltage signal line 13 and both a source and a drain included in the driving circuit structure 14 are located in the source-drain metal layer. By arranging the voltage signal line 13 and both the source and the drain included in the driving circuit structure 14 in a same layer, a structure of the display substrate 100 is simplified, and the display substrate 100 is easier to be manufactured. Herein, it will be noted that the source-drain metal layer is patterned, and although the voltage signal line 13 and both the source and the drain included in the driving circuit structure 14 are located in the source-drain metal layer, there is a gap between the voltage signal line 13 and both the source and the drain included in the driving circuit structure 14, that is, the voltage signal line 13 and both the source and the drain included in the driving circuit structure 14 are disconnected, and are not in electrical contact. For example, each sub-pixel in the display region $Q_1$ of the display substrate 100 includes a pixel circuit structure, and the source and the drain included in the pixel circuit structure are also disposed in the source-drain metal layer.

Figure 4:
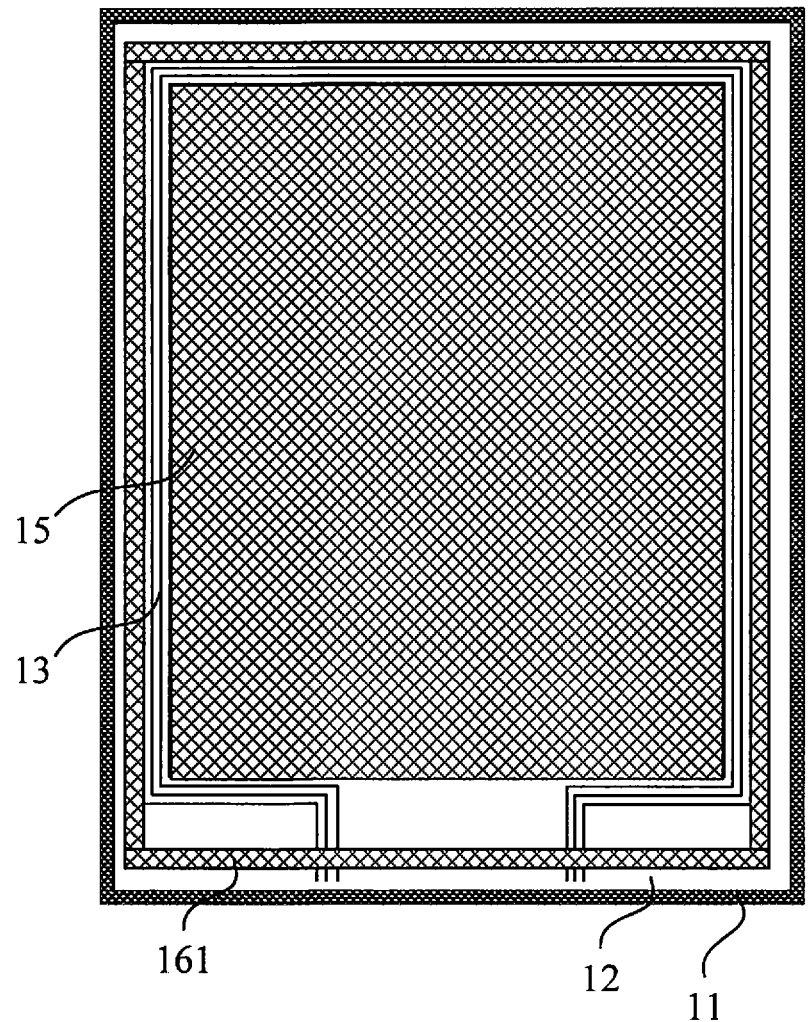

Referring to FIGS. 2 and 4, the planarization layer includes a planarization layer body 15 disposed between the source-drain metal layer, and the pixel defining layer body 20 and the cathode overlapping layer 17. The planarization layer body 15 extends from the display region $Q_1$ to the non-display region $Q_2$, and an edge of the planarization layer body 15 is located in the non-display region $Q_2$. The planarization layer body 15 completely covers the driving circuit structure. The cathode overlapping layer 17 covers an edge of the planarization layer body 15 away from the display region $Q_1$ in the first direction X, and covers at least a part of a surface of the planarization layer body 15 away from the base 11. By providing the planarization layer body 15, film layers located on the planarization layer body 15 (e.g., the pixel defining layer body 20, a part of the cathode overlapping layer 17, and the plurality of anodes 18 shown in FIGS. 6 and 7) may be flatter.

Figure 5:
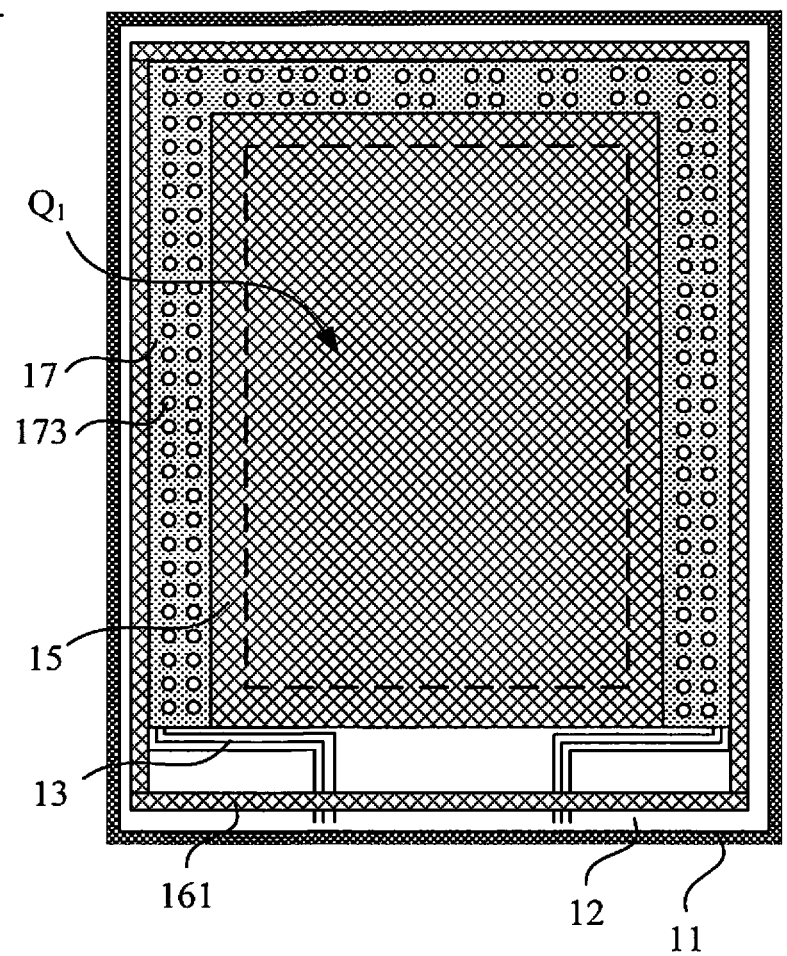

In some embodiments, referring to FIGS. 2, 5 and 6, the cathode overlapping layer 17 is provided with a plurality of through holes 173 distributed in an array. At least one of the plurality of through holes 173 penetrates the cathode overlapping layer 17. An orthographic projection of at least one of the plurality of through holes 173 on the base 11 is within a range of an orthographic projection of the planarization layer body 15 on the base 11. In this way, gas generated in a film layer (e.g., the planarization layer body 15) below the cathode overlapping layer 17 may be released in the process of manufacturing the display substrate 100, thereby improving the reliability of the display substrate.

On this basis, referring to FIGS. 2 and 7, for example, the display substrate 100 further includes a plurality of fillers 201. The plurality of fillers 201 are filled in the plurality of through holes 173 in a one-to-one correspondence manner. A material of at least one of the plurality of fillers 201 is the same as a material of the pixel defining layer body 20. In this way, on the one hand, an upper surface of the cathode overlapping layer 17 may be flatter, and other film layers may be conveniently manufactured on the cathode overlapping layer 17; on the other hand, the plurality of fillers 201 and the pixel defining layer 20 may be manufactured in a same layer, which has an advantage of ease of manufacture. Herein, it will be noted that, in a case where the cathode layer 24 overlaps the cathode overlapping layer 17, a region that actually achieves electrical connection is grid-shaped, and the through holes 173 filled with fillers in the middle are non-conductive.

For example, the through holes 173 are square holes or circular holes or other irregularly shaped holes.

In some embodiments, referring to FIG. 2, the display substrate 100 further includes a first barrier dam 16. The first barrier dam 16 is disposed at the first side of the base 11, and the first barrier dam 16 is located in the non-display region $Q_2$. The source-drain metal layer (i.e., the source-drain metal layer including the voltage signal line 13 and both the source and the drain of the driving circuit structure 14 in FIG. 2)

extends to a side face of the first barrier dam 16 proximate to the display region $Q_1$ in a direction from the display region $Q_1$ to the non-display region $Q_2$ (i.e., the first direction X).

The cathode overlapping layer 17 extends to the side face of the first barrier dam 16 proximate to the display region $Q_1$ in the direction from the display region $Q_1$ to the non-display region $Q_2$ (i.e., the first direction X), and a part of the cathode overlapping layer 17 (e.g., the first portion 171) in electrical contact with the voltage signal line 13 is located between the planarization layer body 15 and the first barrier dam 16 in the first direction X.

In this embodiment, the manufacturing positions of the voltage signal line 13 and the cathode overlapping layer 17 in the source-drain metal layer may be defined by the first barrier dam 16, thereby achieving a purpose of simplifying the manufacturing process of the display substrate. It will be noted that the first barrier dam 16 is annular and is arranged around the display region $Q_1$ in a circle. In the actual manufacturing process, the first barrier dam 16 has a regular trapezoidal shape (that is, in the direction perpendicular to the base, an area of a surface of the first barrier dam 16 proximate to the base 11 is greater than an area of a surface of the first barrier dam 16 away from the base 11), and thus the side face of the first barrier dam 16 proximate to the display region $Q_1$ in the first direction X is an inclined surface. In this way, after the source-drain metal layer and the cathode overlapping layer 17 are manufactured, the source-drain metal layer and the cathode overlapping layer 17 may partially overlap the first barrier dam 16.

In some embodiments, a material of the first barrier dam 16 includes a material for forming the pixel defining layer body 20, or a material for forming the planarization layer body 15, or the material for forming the pixel defining layer body 20 and the material for forming the planarization layer body 15. For example, as shown in FIGS. 2, and 4 to 13, the first barrier dam 16 includes a first barrier layer 161 that is made of a same material and manufactured in a same layer as the planarization layer body 15, and a second barrier layer 162 that is made of a same material and manufactured in a same layer as the pixel defining layer body 20. The first barrier layer 161 and the second barrier layer 162 are sequentially superposed to form the first barrier dam 16.

It will be noted that the first barrier dam 16 may also include only one of the first barrier layer 161 and the second barrier layer 162. For example, the first barrier dam 16 only includes the first barrier layer 161. Alternatively, the first barrier dam 16 only includes the second barrier layer 162. Moreover, in some other examples, the first barrier dam 16 may include three or more barrier layers. That is, in addition to the first barrier layer 161 and the second barrier layer 162, the first barrier dam 16 may further include one or more barrier layers, any of which is made of a same material as an inorganic insulating layer such as the interlayer dielectric layer 12 in FIG. 2, the gate insulation layer (not shown) or the passivation layer. The first barrier dam 16 may overlap other functional layer(s) such as a gate metal layer (not shown in the figure) and an active semiconductor layer (not shown in the figure) to achieve a desired height of the first barrier dam.

The barrier layer(s) are located between the first barrier layer 161 and the base 11.

One or more barrier layers included in the first barrier dam 16 are made of organic materials. In the manufacturing process of the first barrier dam 16, a baking process may be included. For example, after the first barrier layer 161 and the second barrier layer 162 are manufactured, the first barrier layer 161 and the second barrier layer 162 are formed as an integrated structure through the baking process.

In some embodiments, as shown in FIG. 2, the display substrate 100 further includes inorganic insulating layers disposed at the first side of the base 11. The inorganic insulating layers include the interlayer dielectric layer 12, the gate insulating layer (not shown) and the passivation layer (not shown) that are closer to the base 11 than the source-drain metal layer. In some embodiments, the display substrate 100 further includes the gate metal layer, the active semiconductor layer, and other layers, which are disposed at the first side of the base 11.

The interlayer dielectric layer 12 extends from the display region $Q_1$ to the non-display region $Q_2$, and an edge of the interlayer dielectric layer 12 is located at a side of the first barrier dam 16 away from the display region $Q_1$ in the first direction X. At least one groove 121 is formed in a part of the interlayer dielectric layer 12 extending to the side of the first barrier dam 16 away from the display region $Q_1$ in the first direction X. The at least one groove 121 is arranged around the first barrier dam 16. In this way, in the process of manufacturing the display substrate 100, the at least one groove 121 may prevent cracks in the inorganic insulating layers (including the interlayer dielectric layer 12) from extending inward to affect the display region, and thereby the reliability of the display substrate 100 may be improved.

For example, the display substrate 100 is an electroluminescent display substrate.

In some embodiments, as shown in FIGS. 6 and 7, the display substrate 100 further includes the anode layer that is disposed between the planarization layer body 15 and the pixel defining layer body 20 and located in the display region $Q_1$. The anode layer includes the plurality of anodes 18, and the plurality of anodes 18 are in one-to-one correspondence with the plurality of openings 202.

In some embodiments, as shown in FIGS. 2, and 8 to 10, the display substrate 100 further includes at least one organic functional layer disposed on a side of the pixel defining layer body 20 away from the base 11 in the direction perpendicular to the base. The at least one organic functional layer extends from the display region $Q_1$ to the non-display region $Q_2$, and an edge of the at least one organic functional layer is located in the non-display region $Q_2$. The edge of the at least one organic functional layer is closer to the display region $Q_1$ than the edge $z_1$ of the pixel defining layer body 20.

For example, as shown in FIG. 2, a distance $d_1$ between the edge of the at least one organic functional layer in the non-display region $Q_2$ and the display region $Q_1$ is greater than or equal to 100 μm, for example, $d_1$ is 100 μm, 110 μm, 120 μm, 130 μm or 150 μm; a distance $d_2$ between the edge of the at least one organic functional layer in the non-display region $Q_2$ and the edge $z_1$ of the pixel defining layer body 20 is greater than or equal to 50 μm, for example, $d_2$ is 50 μm, 60 μm, 70 μm, 80 μm or 100 μm. Since $L_1$ is equal to a sum of $d_1$, $d_2$, $D_1$ and $d_4$ (i.e., $L_1=d_1+d_2+D_1+d_4$), a value of $L_1$ is relatively small in a case where $d_1$ is equal to 100 μm and $d_2$ is equal to 50 μm, thereby reducing the width L of the non-display region $Q_2$ of the display substrate 100 in the first direction X. As a result, the proportion of the non-display region $Q_2$ is reduced, the bezel of the display device using the display substrate 100 is also reduced, and the screen-to-body ratio of the display device is improved.

For example, the at least one organic functional layer includes at least one of an electron transport layer 23, an electron injection layer, an organic light-emitting layer 22, a hole transport layer 21 or a hole injection layer. By providing the electron transport layer 23, the electron injection layer, the hole transport layer 21 and the hole injection layer, carriers may be uniformly injected into the organic light-emitting layer 22, which improves luminous efficiency of the display substrate 100.

It will be noted that at least one of the electron transport layer 23, the electron injection layer, the hole transport layer 21 and the hole injection layer may be a film layer manufactured by using an open mask (OPM). Due to an edge shadow effect, a boundary of the film layer is relatively thin. In the formed display substrate 100, a position of an outermost edge of the film layer is closer to the display region $Q_1$ than the edge $z_1$ of the pixel defining layer body 20.

For example, the organic light-emitting layer 22 may be formed through an evaporation process using a fine metal mask (FMM). The fine metal mask has pre-designed effective opening regions, through which a material for forming the organic light-emitting layer may be deposited at a position of a corresponding opening 202 in the pixel defining layer body 20, thereby forming a plurality of light-emitting portions 221 of the organic light-emitting layer 22.

Figure 8:
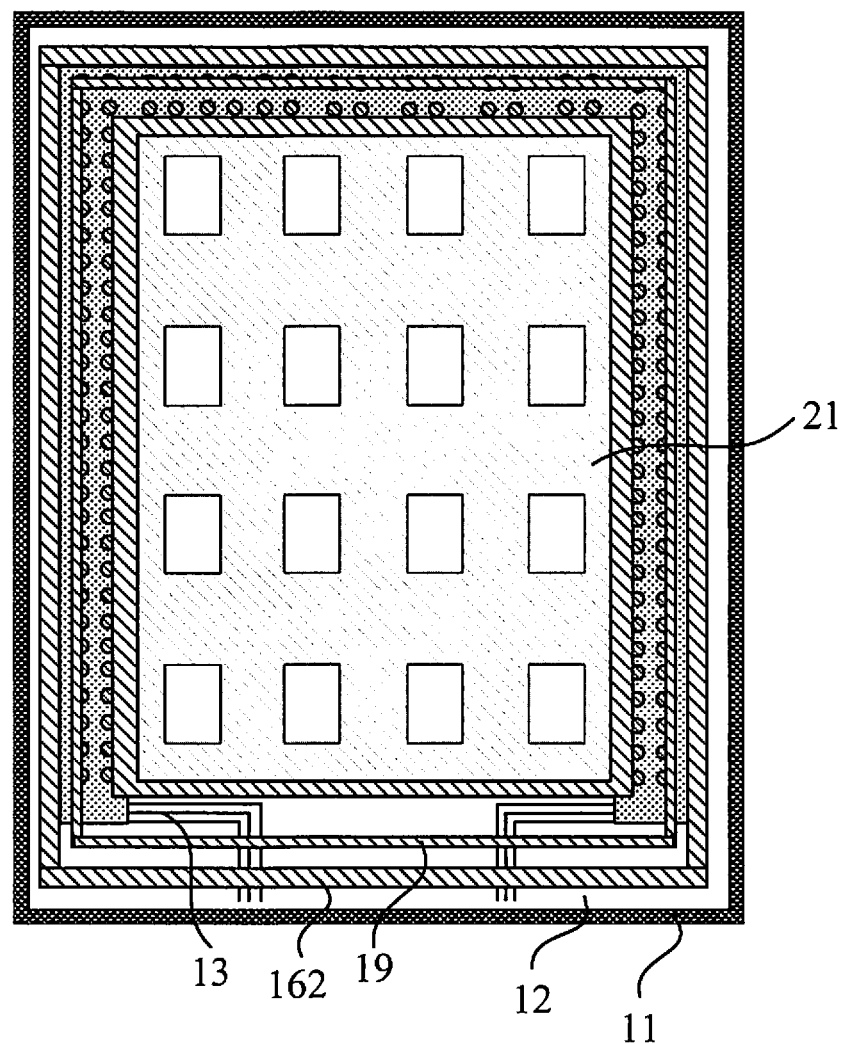
Figure 9:
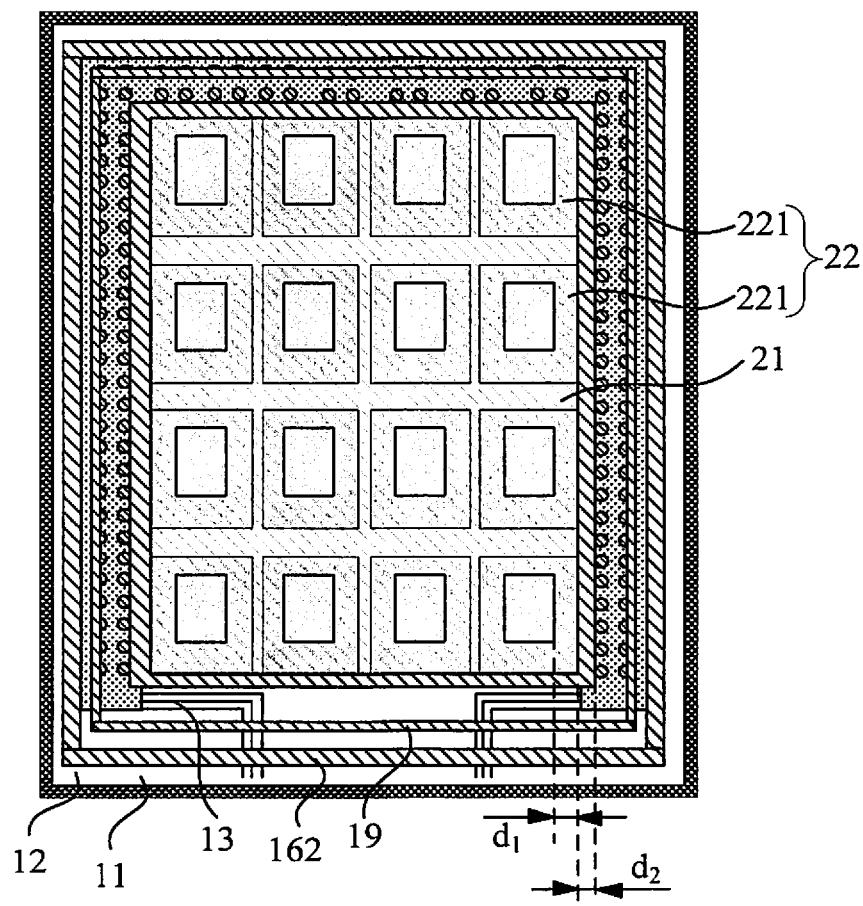
Figure 10:
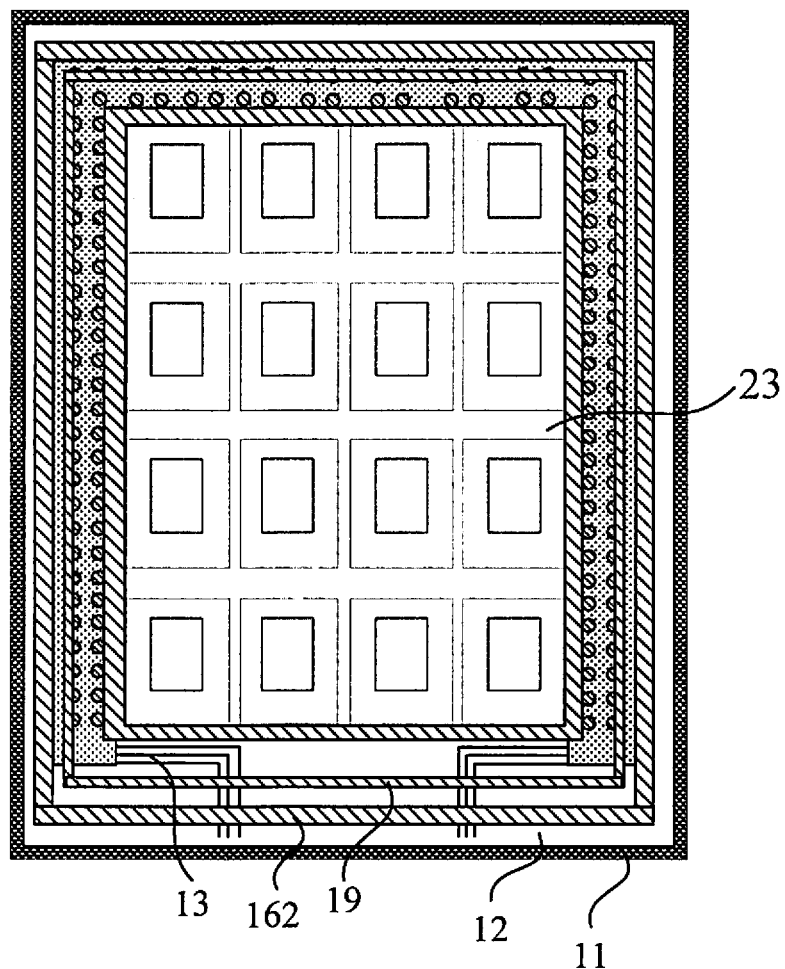

For example, as shown in FIG. 8, an area of an orthographic projection of at least one of the plurality of light-emitting portions 221 on the base 11 is greater than an area of a corresponding opening in the pixel defining layer body (in this case, an area of the effective opening region of the FMM is designed to be greater than the area of the corresponding opening in the pixel defining layer body, so that the area of the orthographic projection of the formed light-emitting portion 221 on the base 11 is greater than the area of the corresponding opening in the pixel defining layer body). An edge of a smallest pattern region (e.g., a rectangular region) where the plurality of light-emitting portions 221 are located (i.e., an outer edge of the entire organic light-emitting layer 22) is closer to the display region $Q_1$ than the edge $z_1$ of the pixel defining layer body 20. In this design, the manufacturing of other film layers is not easily affected. For example, the light-emitting portion 221 will not be formed on the cathode overlapping layer 17, and thus a contact effect of the cathode layer 24 and the cathode overlapping layer 17 will not be affected. In addition, since the area of the orthographic projection of the formed light-emitting portion 221 on the base 11 is greater than the area of the corresponding opening in the pixel defining layer body, light-emitting regions of the sub-pixels defined by openings of the pixel defining layer body may achieve uniform light emission, which is beneficial to improve luminous effect.

Figure 12:
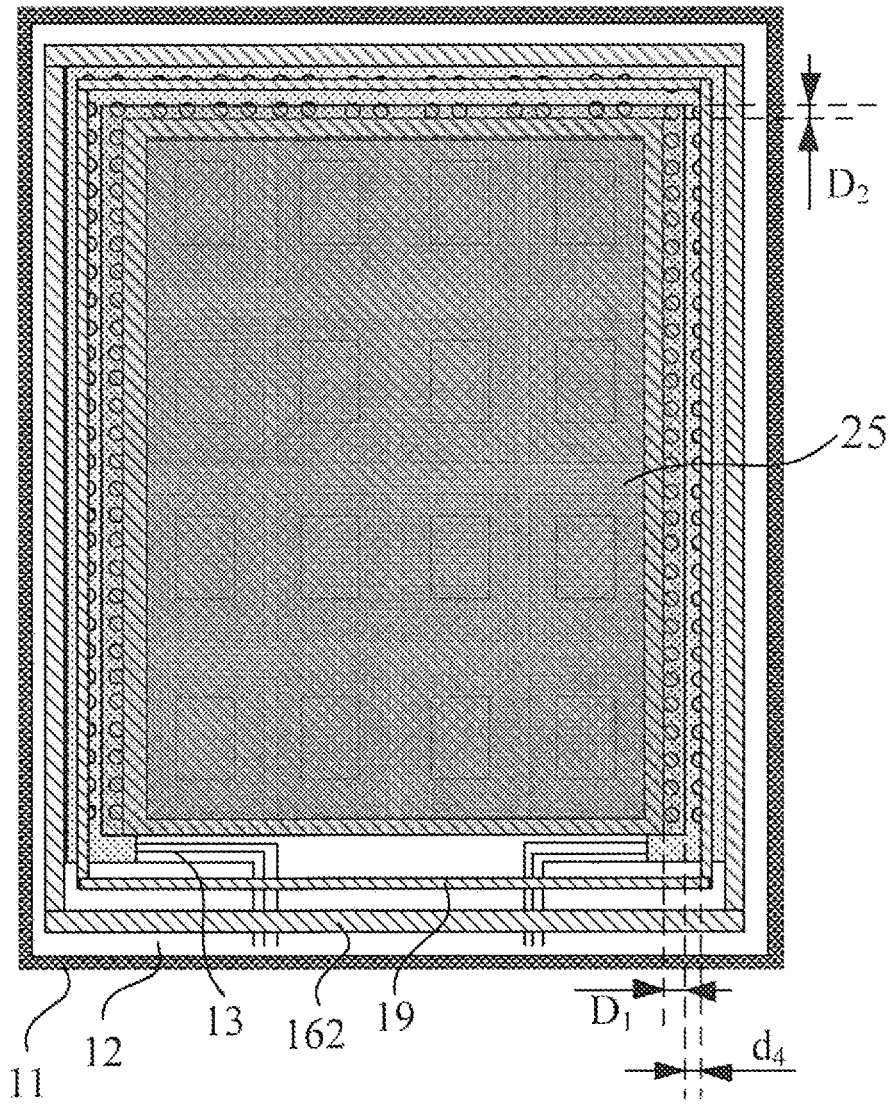

In some embodiments, referring to FIGS. 2 and 12, the display substrate 100 further includes a light extraction layer 25. The light extraction layer 25 is disposed on a side of the cathode layer 24 away from the base 11. The light extraction layer 25 extends from the display region $Q_1$ to the non-display region $Q_2$, and an edge $z_3$ of the light extraction layer 25 is located in the non-display region $Q_2$. An orthographic projection of at least part of the edge of the light extraction layer 25 on the base 11 is within a range of an orthographic projection of the cathode layer 24 on the base 11. In this design, light emission efficiency of the display substrate 100 may be improved through the light extraction layer 25, and an area of the encapsulation layer 27 doesn't need to be greatly increased to realize an effective encapsulation, in which the increasing of the area of the encapsulation layer 27 is caused by a relatively large area of the light extraction layer 25. The encapsulation layer 27 may effectively protect the light extraction layer 25 from being eroded by impurities such as moisture and dust.

For example, the orthographic projection of the entire edge of the light extraction layer 25 on the base 11 is within the range of the orthographic projection of the cathode layer 24 on the base 11. In this case, a distance between the edge $z_3$ of the light extraction layer 25 and a boundary M of display region $Q_1$ (i.e., the interface between the display region $Q_1$ and non-display region $Q_2$) in the first direction X is less than or equal to a distance between the edge $z_2$ of the cathode layer 12 and the boundary M of the display region $Q_1$ in the first direction X. In this way, there is no need to ensure a distance between an edge of the encapsulation layer 27 and the edge $z_3$ of the light extraction layer 25 in the first direction X; it only needs to ensure a distance between the edge of the encapsulation layer and the edge $z_2$ of the cathode layer 24 in the first direction X, and the encapsulation reliability may be guaranteed. Therefore, it is beneficial to reduce a distance between the edge of the encapsulation layer 27 and the boundary M of the display region $Q_1$ in the first direction X, and further a dimension of the non-display region $Q_2$ of the display substrate 100 in the first direction X may be reduced, a proportion of the non-display region $Q_2$ to the entire display substrate 100 may be reduced, the bezel of the display device using the display substrate 100 may be reduced, and the screen-to-body ratio of the display device may be improved. In some embodiments, an orthographic projection of a part of the edge of the light extraction layer 25 on the base 11 is within the range of the orthographic projection of the cathode layer 24 on the base 11. For example, with respect to a rectangular display region, at two long sides, the orthographic projection of the edge of the light extraction layer 25 on the base 11 is within the range of the orthographic projection of the cathode layer 24 on the base 11, which may ensure that a narrow bezel is realized in a direction of opposite sides.

For example, as shown in FIGS. 2 and 12, the orthographic projection of the edge $z_3$ of the light extraction layer 25 on the base 11 substantially coincides with the orthographic projection of the edge $z_2$ of the cathode layer 24 on the base 11. In this way, it is beneficial to reduce the area of the encapsulation layer, so as to reduce the proportion of the non-display region $Q_2$ of the display substrate 100, and it may be avoided that the light emission efficiency of the display substrate 100 is reduced due to a relatively small distance between the edge $z_3$ of the light extraction layer 25 and the boundary M of display region $Q_1$ in the first direction X.

For example, both the orthographic projection of the edge $z_3$ of the light extraction layer 25 on the base 11 and the orthographic projection of the edge $z_2$ of the cathode layer 24 on the base 11 are within a range of an orthographic projection of a part of the cathode overlapping layer 17 (i.e., the second portion 172) covering the planarization layer body 15 on the base 11. In this way, not only may an effective electrical contact between the cathode layer 24 and the cathode overlapping layer 17 be ensured, but also the light emission efficiency of the display substrate 100 may also be effectively improved through the light extraction layer 25.

For example, a material of the light extraction layer 25 includes an organic substance, and a material of the cathode layer 24 includes an inorganic substance. In this design, adhesion between the light extraction layer 25 and the cathode layer 24 may be improved, thereby reducing a stress between film layers, and improving the encapsulation reliability.

It will be noted that, in some embodiments of the present disclosure, both a position of the edge $z_3$ of the light extraction layer 25 and a position of the edge $z_2$ of the cathode layer 24 refer to design positions. For example, both the cathode layer 24 and the light extraction layer 25 are formed through an evaporation process using an OPM. In the process of manufacturing the display substrate 100, a diffusion rate of the cathode layer 24 during the evaporation process may be determined according to material characteristics of the cathode layer 24, and a diffusion rate of the light extraction layer 25 during the evaporation process may be determined according to material characteristics of the light extraction layer 25. Then, according to a design position of each layer and the diffusion rate thereof during the evaporation process, an actual position of an edge of a corresponding layer in the formed display substrate 100 may be obtained. By defining the design position of the edge $z_2$ of the cathode layer 24 and the design position of the edge $z_3$ of the light extraction layer 25 in the embodiments of the present disclosure, the proportion of the non-display region $Q_2$ of the manufactured display substrate 100 may be reduced, and simultaneously, the encapsulation reliability of the display substrate 100 can be guaranteed.

Figure 13:
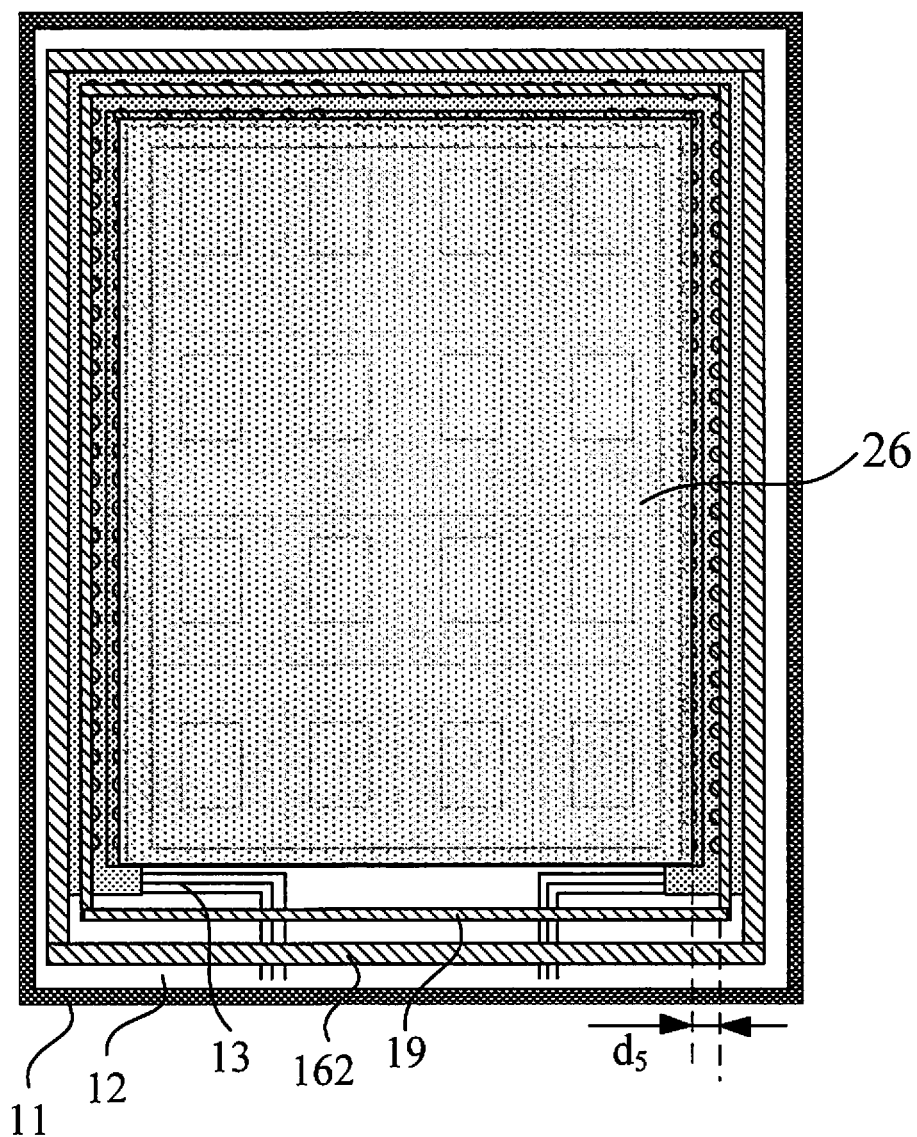
Figure 14:
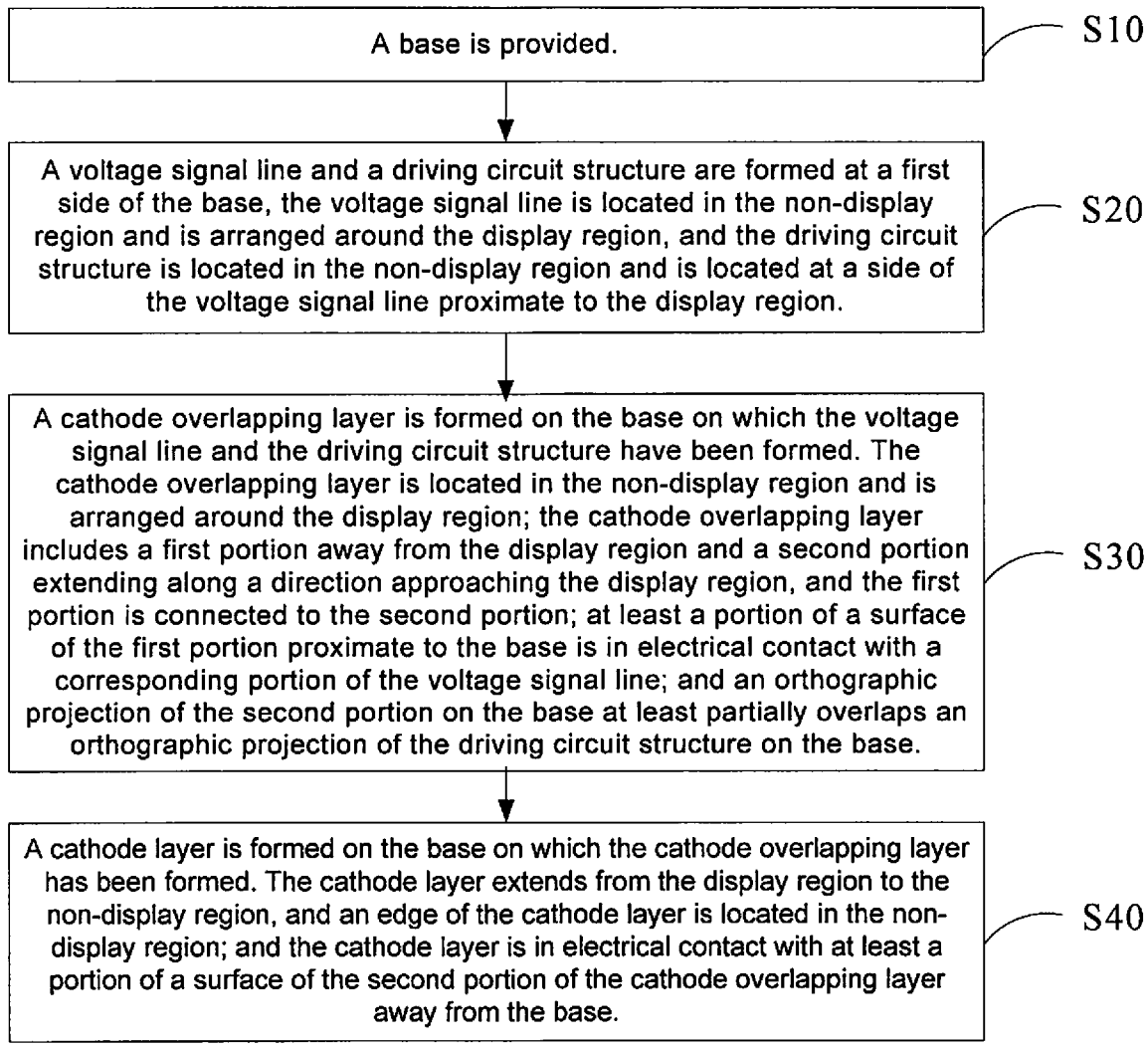
FIG. 14 is a flow chart of a method for manufacturing a display substrate, in accordance with some embodiments of the present disclosure.

In some embodiments, as shown in FIGS. 2 and 13, the display substrate 100 further includes an anti-reflection layer 26. The anti-reflection layer 26 is disposed on a side of the light extraction layer 25 away from the cathode layer 24. The anti-reflection layer 26 extends from the display region $Q_1$ to the non-display region $Q_2$, and an edge $z_4$ of the anti-reflection layer 26 is located in the non-display region $Q_2$. An orthographic projection of the anti-reflection layer 26 on the base 11 is within the range of the orthographic projection of the cathode layer 24 on the base 11.

In this design, the edge $z_4$ of the anti-reflection layer 26 is located between the edge $z_2$ of the cathode layer 24 and the display region $Q_1$ in the first direction X, and a distance between the edge $z_4$ of the anti-reflection layer 26 and the boundary M of the display region $Q_1$ is reduced. In this case, an emission rate of the light may be enhanced by using the anti-reflection layer 26, and an unreliable encapsulation due to a relatively large area of the anti-reflection layer 26 may be avoided. Therefore, there is no need to increase the area of the encapsulation layer 27 to ensure the encapsulation effect, which is beneficial to reduce the proportion of the non-display region $Q_2$ of the display substrate 100, to reduce the bezel of the display device using the display substrate 100, and to improve the screen-to-body ratio of the display device.

For example, edges of the anti-reflection layer 26, the light extraction layer 25 and the cathode layer 24 are farther away from the display region $Q_1$ than the edge $z_1$ of the pixel defining layer body 20 in the first direction X. In this way, it may ensure the brightness uniformity of the display region $Q_1$ while the brightness of the display region $Q_1$ is improved.

It will be noted that a position of the edge $z_4$ of the anti-reflection layer 26 refers to a design position. For example, the anti-reflection layer 26 is formed by an evaporation process using an OPM. In the process of manufacturing the display substrate 100, a diffusion rate of the anti-reflection layer 26 during the evaporation process may be determined according to material characteristics of the anti-reflection layer 26. Then, according to the design position of the anti-reflection layer 26 and the diffusion rate thereof during the evaporation process, an actual position of the edge $z_4$ of the anti-reflection layer 26 in the formed display substrate 100 may be obtained. By defining the design position of the edge $z_4$ of the anti-reflection layer 26 in the embodiments of the present disclosure, the proportion of the non-display region $Q_2$ of the manufactured display substrate 100 may be reduced, and simultaneously, the encapsulation reliability of the display substrate 100 can be guaranteed.

Referring to FIG. 2, the anti-reflection layer 26 is located between the light extraction layer 25 and the encapsulation layer 27. The anti-reflection layer 26 may cause light that enters the anti-reflection layer 26 through the light extraction layer 25 to be reflected for a plurality of times in the anti-reflection layer 26, and then to be incident into the encapsulation layer 27 after interference superposition of the light is formed, and the light exits the encapsulation layer 27. Therefore, the light emission efficiency of the display substrate 100 may be enhanced. For example, an orthographic projection of the edge $z_4$ of the anti-reflection layer 26 on the base 11 is within a range of an orthographic projection of a part of the cathode layer 24 (the part of the cathode layer 24 overlaps the cathode overlapping layer 17) on the base 11. In this way, the light emission efficiency of the display region $Q_1$ of the display substrate 100 may be effectively guaranteed.

For example, a distance between the edge $z_4$ of the anti-reflection layer 26 and the boundary M of the display region in the first direction X is greater than or equal to 120 μm, such as 120 μm, 130 μm, 140 μm, 150 μm or 160 μm. In this design, it is beneficial to ensure the light emission efficiency of the display region $Q_1$ of the display substrate 100.

For example, the anti-reflection layer 26 is a lithium fluoride layer.

In some embodiments, referring to FIGS. 2, and 7 to 13, the display substrate 100 further includes a second barrier dam 19. The second barrier dam 19 is disposed on a surface of the cathode overlapping layer 17 away from the base 11 in the direction perpendicular to the base. The second barrier dam 19 is nonoverlapping with the cathode layer 24, the light extraction layer 25 and the anti-reflection layer 26 in the direction perpendicular to the base 11. That is, the edges of the cathode layer 24, the light extraction layer 25 and the anti-reflection layer 26 are all located at a side of the second barrier dam 19 proximate to the display region $Q_1$ in the first direction X. For example, the second barrier dam 19 is arranged around the display region $Q_1$ in a full circle. The second barrier dam 19 overlaps both the cathode overlapping layer 17 and the voltage signal line 13 in the direction perpendicular to the base.

For example, as shown in FIG. 2, a material of the second barrier dam 19 includes the material for forming the pixel defining layer body 20. For example, the second barrier dam 19 may include a second barrier dam sub-layer that is manufactured in a same layer and made of a same material as the pixel defining layer body 20. In this way, it is beneficial to simplify the manufacturing process of the display substrate. For example, the second barrier dam 19 overlaps one or more inorganic insulating layers (such as the gate insulating layer, the passivation layer and the interlayer insulating layer) located between the source-drain metal layer and the base 11. The second barrier dam 19 may further overlap other functional layer(s) (such as the gate metal layer (not shown in the figure) and the active semiconductor layer (not shown in the figure)) to achieve a desired height of the second barrier dam.

The arrangement of the second barrier dam 19 may prevent the organic material in the encapsulation layer from overflowing, thereby ensuring the encapsulation reliability. It will be noted that an organic layer in the encapsulation layer may be formed by printing organic material ink. In actual manufacturing, a small part of the organic material may overflow the second barrier dam 19. Therefore, in some embodiments, a part of the material of the organic layer in the encapsulation layer exists between the first barrier dam 16 and the second barrier dam 19. For example, a farthest boundary of the organic layer in the encapsulation layer away from the display region does not exceed a region defined by the first barrier dam 16. That is, the farthest boundary of the organic layer in the encapsulation layer away from the display region is at the side of the first barrier dam 16 proximate to the display region in the first direction X.

In some embodiments, referring to FIGS. 2 and 12, a distance $d_4$ between the edge $z_2$ of the cathode layer 24 and the second barrier dam 19 in the first direction X (that is, a distance between the edge $z_2$ of the cathode layer 24 and the side face of the second barrier dam 19 proximate to the display region in the first direction X) is greater than or equal to 80 μm. In this way, after the display substrate 100 is formed, the cathode layer 24 is not prone to covering the second barrier dam 19, that is, an actual edge of the cathode layer 24 is still located at the side of the second barrier dam 19 proximate to the display region $Q_1$ in the first direction X, so that the second barrier dam 19 is in contact with the encapsulation layer 27 to ensure the encapsulation reliability. For example, $d_4$ is 80 μm, 90 μm, 100 μm, 110 μm or 120 μm. Since $L_1$ is equal to a sum of $d_1$, $d_2$, $D_1$ and $d_4$ (i.e., $L_1=d_1+d_2+D_1+d_4$), a value of $L_1$ is relatively small in a case where $d_4$ is equal to 80 μm. As described above, a minimum value of $d_1$ is 100 μm, a minimum value of $d_2$ is 50 μm, and a minimum value of $D_1$ is 150 μm, and thus a minimum value of $L_1$ is 380 μm. In this way, it is beneficial to reduce the width L of the non-display region $Q_2$ of the display substrate 100 in the first direction X. Therefore, the proportion of the non-display region $Q_2$ is reduced, the bezel of the display device using the display substrate 100 is reduced, and the screen-to-body ratio of the display device is improved.

Herein, it will be noted that in a case where the anti-reflection layer 26 is formed by the evaporation process using the OPM, a material of the anti-reflection layer 26 (e.g., the lithium fluoride layer) moves farther in the evaporation process, that is, the diffusion rate is relatively faster. In some embodiments of the present disclosure described above, the distance $d_4$ between the edge $z_2$ of the cathode layer 24 and the second barrier dam 19 in the first direction X is greater than or equal to 80 μm, and the orthographic projection of the anti-reflection layer 26 on the base is within the range of the orthographic projection of the cathode layer 24 on the base 11, so that in the formed display substrate 100, the anti-reflection layer 26 (e.g., the lithium fluoride layer) is not prone to covering the second barrier dam 19. Therefore, it is not easy to cause a phenomenon that the encapsulation layer 27 is separated from the second barrier dam 19, which may lead to encapsulation leakage, oxidation of the display substrate 100, and formation of non-luminescent black clusters in the display region $Q_1$ of the display substrate 100.

On this basis, for example, as shown in FIGS. 2 and 13, a distance $d_5$ between the edge $z_4$ of the anti-reflection layer 26 and the second barrier dam 19 in the first direction X (i.e., a distance between the edge $z_4$ of the anti-reflection layer 26 and the side face of the second barrier dam 19 proximate to the display region in the first direction X) is greater than or equal to 250 μm. In this way, it is more effective to prevent the anti-reflection layer 26 from being evaporated onto the second barrier dam 19, thereby ensuring the encapsulation effect. For example, $d_5$ is 250 μm, 260 μm, 270 μm, 280 μm or 290 μm.

In some embodiments, referring to FIGS. 1 and 2, the display substrate 100 further includes the encapsulation layer 27, and the encapsulation layer 27 includes a first inorganic barrier layer 271, an organic barrier layer 272 and a second inorganic barrier layer 273. The first inorganic barrier layer 271 is disposed on a side of the anti-reflection layer 26 away from the light extraction layer 25, and covers the second barrier dam 19. The organic barrier layer 272 is disposed on a side of the first inorganic barrier layer 271 away from the anti-reflection layer 26, and is located at least within a region enclosed by the second barrier dam 19. The second inorganic barrier layer 273 is disposed on a side of the organic barrier layer 272 away from the first inorganic barrier layer 271, and covers the second barrier dam 19.

The first inorganic barrier layer 271 and the second inorganic barrier layer 273 have a function of blocking moisture and oxygen, and the organic barrier layer 272 has certain flexibility, so that the formed encapsulation layer 27 may make the display substrate 100 have a good encapsulation effect, and a phenomenon of encapsulation leakage is not easy to occur. In addition, by providing the second barrier dam 19, in a process of forming the organic barrier layer 272, the second barrier dam 19 can be used to prevent a material for forming the organic barrier layer from overflowing out of the region enclosed by the second barrier dam 19, and thereby it is beneficial to ensure the encapsulation reliability.

For example, the display substrate 100 includes both the first barrier dam 16 and the second barrier dam 19. There is a gap between the first barrier dam 16 and the second barrier dam 19 (e.g., a gap of 30 μm to 50 μm), and both the first inorganic barrier layer 271 and the second inorganic barrier layer 273 in the encapsulation layer 27 cover the first barrier dam 16 and the second barrier dam 19, which is beneficial to improve the encapsulation reliability. Due to process reasons, there may exist a part of a material of the organic barrier layer 272 between the first barrier dam 16 and the second barrier dam 19. In this case, by arranging the first barrier dam 16 at a periphery of the second barrier dam 19 in a circle, it is possible to more effectively prevent the part of the material of the organic barrier layer 272 from overflowing the first barrier dam 16. For example, heights of the first barrier dam 16 and the second barrier dam 19 may be same or different. For example, a surface of the second barrier dam 19 away from the substrate is lower than a surface of the first barrier dam 16 away from the substrate.

It will be noted that the first barrier dam 16 may block the material of the organic barrier layer 272 after the material of the organic barrier layer 272 overflows the region enclosed by the second barrier dam 19. Therefore, it will be understood that the larger the number of barrier dams (i.e., the first barrier dam 16 and the second barrier dam 19), the more beneficial it is to block overflow of the material for forming the organic barrier layer 152, and the encapsulation reliability may be guaranteed. However, too many barrier dams may affect the dimension of the non-display region $Q_2$ of the display substrate 100 in the first direction X, and may increase the proportion of the non-display region $Q_2$. Therefore, in some embodiments of the present disclosure, the first barrier dam 16 and the second barrier dam 19 are provided. In this way, the material for forming the organic barrier layer 152 may be effectively blocked during the manufacturing process, and the width of the non-display region $Q_2$ of the display substrate 9 in the first direction X will not be greatly affected.

For example, a material of the first inorganic barrier layer 271 includes one or more of silicon nitride $SiN_x$, silicon dioxide $SiO_x$ and silicon oxynitride SiON. The first inorganic barrier layer 271 is formed through a chemical vapor deposition (CVD) process.

For example, the material of the organic barrier layer 272 includes one or more of acrylic-based polymer, silicon-based polymer and epoxy-based polymer. The material is manufactured on the first inorganic barrier layer 271 in an ink jet printing (IJP) manner, and is cured by ultraviolet (UV) to form the organic barrier layer 272.

For example, a material of the second inorganic barrier layer 273 includes a combination of one or more of silicon nitride $SiN_x$, silicon dioxide $SiO_x$ and silicon oxynitride SiON. The second inorganic barrier layer 273 is formed by using a chemical vapor deposition (CVD) process.

Some embodiments of the present disclosure provide a method for manufacturing a display substrate. Referring to FIGS. 2 to 11, and 14, the method includes S10 to S40.

In S10, a base 11 is provided.

In S20, a voltage signal line 13 and a driving circuit structure 14 are formed at a first side of the base, the voltage signal line 13 is located in the non-display region $Q_2$ and is arranged around the display region $Q_1$, and the driving circuit structure 14 is located in the non-display region 2 and is located at a side of the voltage signal line 13 proximate to the display region $Q_1$ in the first direction X.

In S30, a cathode overlapping layer 17 is formed on the base 11 on which the voltage signal line 13 and the driving circuit structure 14 have been formed. The cathode overlapping layer 17 is located in the non-display region $Q_2$ and is arranged around the display region $Q_1$; the cathode overlapping layer 17 includes a first portion 171 away from the display region $Q_1$ and a second portion 172 extending along a direction approaching the display region $Q_1$, and the first portion 171 is connected to the second portion 172; at least a part of a surface of the first portion 171 proximate to the base 11 is in electrical contact with a corresponding part of the voltage signal line 13; and an orthographic projection of the second portion 172 on the base 11 at least partially overlaps an orthographic projection of the driving circuit structure 14 on the base 11.

In S40, a cathode layer 24 is formed on the base 11 on which the cathode overlapping layer 17 has been formed. The cathode layer 24 extends from the display region $Q_1$ to the non-display region $Q_2$, and an edge $z_2$ of the cathode layer 24 is located in the non-display region $Q_2$; and the cathode layer 24 is in electrical contact with at least a part of a surface of the second portion 172 of the cathode overlapping layer 17 away from the base 11.

In the display substrate formed by the method, an electrical connection between the cathode layer 24 and the voltage signal line 13 may be guaranteed; meanwhile, an area of the cathode layer 24 may be reduced. Therefore, an area of an encapsulation layer may be correspondingly reduced; meanwhile, the encapsulation reliability is guaranteed, so that a dimension of the non-display region $Q_2$ of the display substrate 100 in a first direction X is reduced, that is, a proportion of the non-display region $Q_2$ to the entire display substrate is reduced. In this way, a bezel of a display device using the display substrate 100 may be correspondingly reduced, and a screen-to-body ratio of the display device may be improved.

Figure 15:
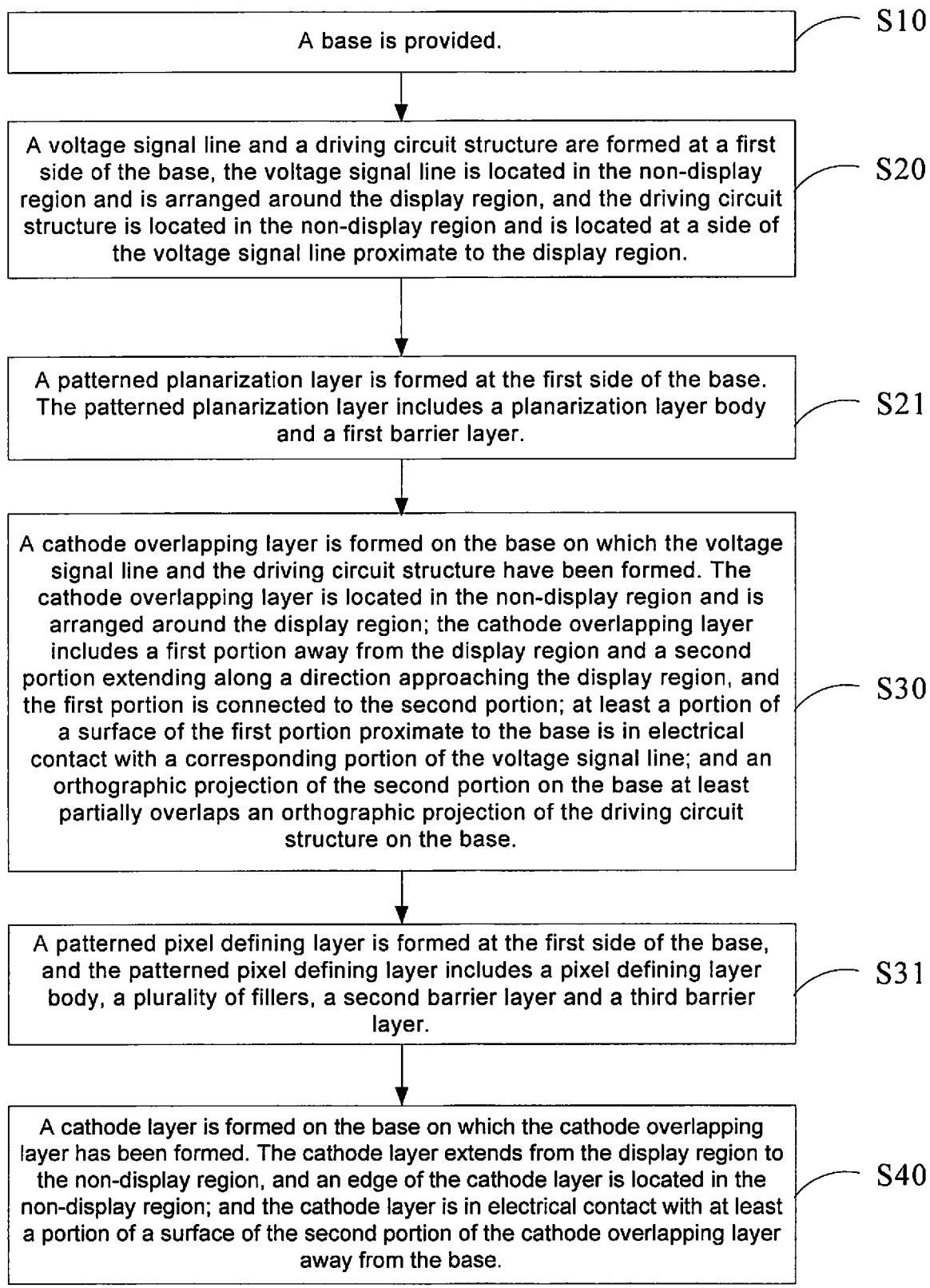
FIG. 15 is a flow chart of another method for manufacturing a display substrate, in accordance with some embodiments of the present disclosure.

In some embodiments, referring to FIGS. 2, 4 and 15, before S30, the method further includes S21.

In S21, a patterned planarization layer is formed at the first side of the base 11. The patterned planarization layer includes a planarization layer body 15 and a first barrier layer 161.

The planarization layer body 15 extends from the display region $Q_1$ to the non-display region $Q_2$, and an edge of the planarization layer body 15 is located in the non-display region $Q_2$. The planarization layer body 15 is nonoverlapping with the voltage signal line 13 in a direction perpendicular to the base 11, and the planarization layer body 15 completely covers the driving circuit structure 14. By providing the planarization layer body 15, film layers located on the planarization layer body 15 (e.g., the pixel defining layer body 20, a part of the cathode overlapping layer 17, and the plurality of anodes 18 shown in FIGS. 6 and 7) may be flatter.

The first barrier layer 161 is located at a side of the voltage signal line 13 away from the display region $Q_1$ in the first direction X, and the first barrier layer 161 is a part of a first barrier dam 16.

In some embodiments, referring to FIGS. 2, 7 and 15, before S40, the method further includes S31.

In S31, a patterned pixel defining layer is formed at the first side of the base 11, and the patterned pixel defining layer includes a pixel defining layer body 20, a plurality of fillers 201, a second barrier layer 162 and a third barrier layer.

The pixel defining layer body 20 extends from the display region $Q_1$ to the non-display region $Q_2$, and an edge $z_1$ of the pixel defining layer body 20 is located in the non-display region $Q_2$. The pixel defining layer body 20 covers an edge of the cathode overlapping layer 17 proximate to the display region $Q_1$ in the first direction X, and covers a part of the surface of the second portion 172 of the cathode overlapping layer 17 away from the base 11. The edge $z_1$ of the pixel defining layer body 20 is closer to the display region $Q_1$ than the edge $z_2$ of the cathode layer 24. In this way, on the one hand, a position of the cathode overlapping layer 17 may be defined by the pixel defining layer body 20; on the other hand, a part of the surface of the second portion 172 of the cathode overlapping layer 17 away from the base 11 may be exposed to prevent the pixel defining layer body 20 from affecting the electrical contact between the cathode layer 24 and the cathode overlapping layer 17. In this case, the cathode layer 24 includes a portion covering the pixel defining layer body 20 and a portion covering the cathode overlapping layer 17, and the two portions are continuous. A part of the pixel defining layer body 20 located in the display region $Q_1$ has a plurality of openings 202. The plurality of openings 202 are configured to define light-emitting regions of a plurality of sub-pixels. In this way, the display substrate 100 may display an image by controlling the plurality of sub-pixels to emit light.

Referring to FIGS. 6 and 7, the cathode overlapping layer 17 has a plurality of through holes 173 distributed in an array, at least one of the plurality of through holes 173 penetrates a surface of the cathode overlapping layer 17 away from the base 11 and a surface of the cathode overlapping layer 17 proximate to the base 11, and the plurality of fillers 201 are filled into the plurality of through holes 173 in a one-to-one correspondence manner. In this way, on the one hand, an upper surface of the cathode overlapping layer 17 may be flat, which facilitates the manufacturing of other film layers on the cathode overlapping layer 17; on the other hand, a manufacturing process of the display substrate 100 may be simplified by manufacturing the plurality of fillers 201 and the pixel defining layer body 20 in a same layer.

Referring to FIG. 2, the second barrier layer 162 is located on a surface of the first barrier layer 161 away from the base 11. That is, the second barrier layer 162 is a part of the first barrier dam 16. The third barrier layer is located on the surface of the cathode overlapping layer 17 away from the base 11, the third barrier layer constitutes a second barrier dam 19, or the third barrier layer is a part of the second barrier dam 19.

Figure 16:
FIG. 16 is a structural diagram of a display device, in accordance with some embodiments of the present disclosure.

Some embodiments of the present disclosure provide a display device. As shown in FIG. 16, a display device 200 includes the display substrate 100 as described in any of the above embodiments.

For example, the display device 200 is an electroluminescent display device, such as a liquid crystal panel, electronic paper, a mobile phone, a tablet computer, a television, a display, a notebook computer, a digital photo frame, a navigator and any product or component having a display function.

The proportion of the non-display region $Q_2$ of the display substrate 100 in some embodiments of the present disclosure is relatively small. Therefore, by mounting the display substrate 100 in a display device, a bezel of the display device 200 may be reduced, and a screen-to-body ratio of the display device 200 (i.e., at a display side of the display device 200, a proportion of an area of a display screen to a total area of a surface of the display device at the display side (including the area of the screen and an area of the bezel)) may be improved.

The foregoing descriptions are merely specific implementation manners of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A display substrate having a display region and a non-display region adjacent to the display region, the display substrate comprising:
    a base;
    a voltage signal line disposed at a first side of the base, wherein the voltage signal line is located in the non-display region and is arranged around the display region;
    a driving circuit structure disposed at the first side of the base, wherein the driving circuit structure is located in the non-display region and is located at a side of the voltage signal line proximate to the display region in a first direction;
    a cathode overlapping layer disposed at a side of the voltage signal line and a side of the driving circuit structure that are away from the base in a direction perpendicular to the base, wherein the cathode overlapping layer is located in the non-display region and is arranged around the display region; the cathode overlapping layer includes a first portion and a second portion, the first portion is disposed away from the display region than the second portion, the second portion extends along a direction approaching the display region, and the first portion is connected to the second portion; at least a part of a surface of the first portion proximate to the base is in electrical contact with a corresponding part of the voltage signal line; and an orthographic projection of the second portion on the base at least partially overlaps an orthographic projection of the driving circuit structure on the base;
    a cathode layer disposed at the first side of the base, wherein the cathode layer extends from the display region to the non-display region, and an edge of the cathode layer is located in the non-display region; and the cathode layer is in electrical contact with at least a part of a surface of the second portion of the cathode overlapping layer away from the base;
    a pixel defining layer disposed at the first side of the base, wherein the pixel defining layer includes a pixel defining layer body located at a side of the cathode layer proximate to the base in the direction perpendicular to the base, the pixel defining layer body extends from the display region to the non-display region, and an edge of the pixel defining layer body is located in the non-display region; the pixel defining layer body covers an edge of the cathode overlapping layer proximate to the display region in the first direction, and covers a part of the surface of the second portion of the cathode overlapping layer away from the base, and the edge of the pixel defining layer body is closer to the display region than the edge of the cathode layer in the first direction; and a part of the pixel defining layer body located in the display region has a plurality of openings, and the plurality of openings are configured to define light-emitting regions of a plurality of sub-pixels;
    a source-drain metal layer disposed at the first side of the base, wherein the voltage signal line and both a source and a drain included in the driving circuit structure are located in the source-drain metal layer; and
    a planarization layer disposed at the first side of the base, wherein the planarization layer includes a planarization layer body disposed between the source-drain metal layer, and the pixel defining layer body and the cathode overlapping layer, the planarization layer body extends from the display region to the non-display region, and an edge of the planarization layer body is located in the non-display region; the planarization layer body completely covers the driving circuit structure,
    wherein
    the first direction is a direction parallel to the base and perpendicular to an interface between the display region and the non-display region;
    the cathode overlapping layer covers the edge of the planarization layer body in the non-display region, and covers at least a part of a surface of the planarization layer body away from the base;
    the cathode overlapping layer has a plurality of through holes distributed in an array, and at least one through hole of the plurality of through holes penetrates the cathode overlapping layer;
    an orthographic projection of at least one of the plurality of through holes on the base is within a range of an orthographic projection of the planarization layer body on the base; and
    the display substrate further comprises:
        a plurality of fillers that are filled in the plurality of through holes in a one-to-one correspondence manner, and a material of at least one filler of the plurality of fillers is the same as a material of the pixel defining layer body.

2. The display substrate according to claim 1, further comprising:
    a first barrier dam disposed at the first side of the base, wherein the first barrier dam is located in the non-display region, and the source-drain metal layer extends to a side face of the first barrier dam proximate to the display region in a direction from the display region to the non-display region; and the cathode overlapping layer extends to the side face of the first barrier dam proximate to the display region in the direction from the display region to the non-display region, and a part of the cathode overlapping layer in electrical contact with the voltage signal line is located between the planarization layer body and the first barrier dam in the first direction.

3. The display substrate according to claim 2, wherein the first barrier dam includes a material for forming the pixel defining layer body, or a material for forming the planarization layer body, or the material for forming the pixel defining layer body and the material for forming the planarization layer body.

4. The display substrate according to claim 2, further comprising:

an inorganic insulating layer disposed at the first side of the base, wherein the inorganic insulating layer includes an interlayer dielectric layer closer to the base than the source-drain metal layer; and the interlayer dielectric layer extends from the display region to the non-display region, and an edge of the interlayer dielectric layer is located at a side of the first barrier dam away from the display region in the first direction, and at least one groove is formed in a part of the interlayer dielectric layer extending to a side of the first barrier dam away from the display region in the first direction, and the at least one groove is arranged around the first barrier dam.

5. The display substrate according to claim 1, further comprising:

an anode layer disposed between the planarization layer body and the pixel defining layer body in the direction perpendicular to the base and located in the display region, wherein the anode layer includes a plurality of anodes that are in one-to-one correspondence with the plurality of openings; and at least one organic functional layer disposed on a side of the pixel defining layer body away from the base in the direction perpendicular to the base, wherein the at least one organic functional layer extends from the display region to the non-display region, an edge of the at least one organic functional layer is located in the non-display region, and the edge of the at least one organic functional layer is closer to the display region than the edge of the pixel defining layer body in the first direction.

6. The display substrate according to claim 1, wherein the display region is substantially rectangular, and the cathode overlapping layer is arranged around two long sides and one short side of the rectangular display region.

7. The display substrate according to claim 6, wherein in a region of the non-display region corresponding to the two long sides, a width of a part of the cathode layer that is in contact with the cathode overlapping layer in the first direction is $D_1$, and $D_1$ is greater than or equal to 150 μm and less than or equal to 350 μm; and in a region of the non-display region corresponding to the one short side, a width of the part of the cathode layer that is in contact with the cathode overlapping layer in the first direction is $D_2$, and $D_2$ is less than $D_1$ and greater than zero.

8. The display substrate according to claim 1, further comprising:

a light extraction layer disposed on a side of the cathode layer away from the base in the direction perpendicular to the base, wherein the light extraction layer extends from the display region to the non-display region, and an edge of the light extraction layer is located in the non-display region, and an orthographic projection of at least a part of the edge of the light extraction layer on the base is within a range of an orthographic projection of the cathode layer on the base.

9. The display substrate according to claim 8, wherein an orthographic projection of the edge of the light extraction layer on the base substantially coincides with an orthographic projection of the edge of the cathode layer on the base.

10. The display substrate according to claim 8, further comprising:

an anti-reflection layer disposed on a side of the light extraction layer away from the cathode layer in the direction perpendicular to the base, wherein the anti-reflection layer extends from the display region to the non-display region, and an edge of the anti-reflection layer is located in the non-display region, and an orthographic projection of the anti-reflection layer on the base is within the range of the orthographic projection of the cathode layer on the base.

11. The display substrate according to claim 10, further comprising:

a second barrier dam disposed on a surface of the cathode overlapping layer away from the base, wherein the second barrier dam is located in the non-display region, and the second barrier dam is nonoverlapping with the cathode layer, the light extraction layer and the anti-reflection layer in the direction perpendicular to the base.

12. The display substrate according to claim 11, wherein a distance between the edge of the cathode layer and the second barrier dam in the first direction is greater than or equal to 80 μm; a distance between the edge of the anti-reflection layer and the second barrier dam in the first direction is greater than or equal to 250 μm.

13. The display substrate according to claim 11, further comprising an encapsulation layer, wherein the encapsulation layer includes:

a first inorganic barrier layer disposed on a side of the anti-reflection layer away from the light extraction layer and the first inorganic barrier layer covers the second barrier dam;

an organic barrier layer disposed on a side of the first inorganic barrier layer away from the anti-reflection layer, and the organic barrier layer is located at least in a region enclosed by the second barrier dam; and a second inorganic barrier layer disposed on a side of the organic barrier layer away from the first inorganic barrier layer, and the second inorganic barrier layer covers the second barrier dam.

14. A method for manufacturing a display substrate, the display substrate including a display region and a non-display region adjacent to the display region; and the method comprising:

providing a base;

forming a voltage signal line and a driving circuit structure at a first side of the base, wherein the voltage signal line is located in the non-display region and is arranged around the display region, and the driving circuit structure is located in the non-display region and is located at a side of the voltage signal line proximate to the display region in a first direction;

forming a cathode overlapping layer on the base on which the voltage signal line and the driving circuit structure have been formed, wherein the cathode overlapping layer is located in the non-display region and is arranged around the display region; the cathode overlapping layer includes a first portion and a second portion, the first portion is disposed away from the display region than the second portion, the second portion extends along a direction approaching the display region, and the first portion is connected to the second portion; at least a part of a surface of the first portion proximate to the base is in electrical contact with a corresponding part of the voltage signal line; and an orthographic projection of the second portion on the base at least partially overlaps an orthographic projection of the driving circuit structure on the base; and forming a cathode layer on the base on which the cathode overlapping layer has been formed, wherein the cathode layer extends from the display region to the non-display region, an edge of the cathode layer is located in the non-display region, and the cathode layer is in electrical contact with at least a part of a surface of the second portion of the cathode overlapping layer away from the base, wherein the first direction is a direction parallel to the base and perpendicular to an interface between the display region and the non-display region, wherein before forming the cathode overlapping layer on the base on which the voltage signal line and the driving circuit structure have been formed, the method further comprises:

forming a patterned planarization layer at the first side of the base, wherein the patterned planarization layer includes a planarization layer body and a first barrier layer;

the planarization layer body extends from the display region to the non-display region, and an edge of the planarization layer body is located in the non-display region; the planarization layer body is nonoverlapping with the voltage signal line in a direction perpendicular to the base; and the first barrier layer is located at a side of the voltage signal line away from the display region in the first direction;

wherein before forming the cathode layer on the base on which the cathode overlapping layer has been formed, the method further comprises:

forming a patterned pixel defining layer at the first side of the base, wherein the patterned pixel defining layer includes a pixel defining layer body, a plurality of fillers, a second barrier layer and a third barrier layer;

the pixel defining layer body extends from the display region to the non-display region, and an edge of the pixel defining layer body is located in the non-display region; the pixel defining layer body covers an edge of the cathode overlapping layer proximate to the display region in the first direction, and covers a part of the surface of the second portion of the cathode overlapping layer away from the base; the edge of the pixel defining layer body is closer to the display region than the edge of the cathode layer; a part of the pixel defining layer body located in the display region has a plurality of openings, and the plurality of openings are configured to define light-emitting regions of a plurality of sub-pixels;

the cathode overlapping layer has a plurality of through holes distributed in an array, and at least one through hole of the plurality of through holes penetrates a surface of the cathode overlapping layer away from the base and a surface of the cathode overlapping layer proximate to the base; the plurality of fillers are filled in the plurality of through holes in a one-to-one correspondence manner;

the second barrier layer is located on a surface of the first barrier layer away from the base in a direction perpendicular to the base; and the third barrier layer is located on the surface of the cathode overlapping layer away from the base.

15. A display device, comprising the display substrate according to claim 1.

* * * * *